United States Patent
Sarayama et al.

(10) Patent No.: US 8,337,798 B2
(45) Date of Patent: Dec. 25, 2012

(54) CRYSTAL PRODUCING APPARATUS, CRYSTAL PRODUCING METHOD, SUBSTRATE PRODUCING METHOD, GALLIUM NITRIDE CRYSTAL, AND GALLIUM NITRIDE SUBSTRATE

(75) Inventors: Seiji Sarayama, Miyagi (JP); Hirokazu Iwata, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 411 days.

(21) Appl. No.: 11/906,285

(22) Filed: Oct. 1, 2007

(65) Prior Publication Data
US 2008/0081015 A1 Apr. 3, 2008

(30) Foreign Application Priority Data
Oct. 2, 2006 (JP) .................. 2006-270363
Jul. 31, 2007 (JP) .................. 2007-198607

(51) Int. Cl.
*C01B 21/06* (2006.01)
*C30B 25/02* (2006.01)
(52) U.S. Cl. ...................... 423/409; 117/102
(58) Field of Classification Search .................. None
See application file for complete search history.

(56) References Cited

U.S. PATENT DOCUMENTS

| | | | |
|---|---|---|---|
| 6,592,663 B1 * | 7/2003 | Sarayama et al. | 117/68 |
| 6,616,757 B1 * | 9/2003 | Melnik et al. | 117/102 |
| 6,780,239 B2 | 8/2004 | Sarayama et al. | |
| 6,949,140 B2 | 9/2005 | Sarayama et al. | |
| 7,176,115 B2 * | 2/2007 | Kitaoka et al. | 438/557 |
| 7,220,311 B2 | 5/2007 | Iwata et al. | |
| 7,261,775 B2 | 8/2007 | Iwata et al. | |
| 2003/0164138 A1 | 9/2003 | Sarayama et al. | |
| 2004/0134413 A1 | 7/2004 | Iwata et al. | |
| 2005/0164419 A1 | 7/2005 | Hirota et al. | |
| 2007/0034143 A1 | 2/2007 | Sarayama et al. | |
| 2007/0084399 A1 | 4/2007 | Sarayama et al. | |
| 2007/0128746 A1 | 6/2007 | Iwata et al. | |
| 2007/0215034 A1 | 9/2007 | Iwata et al. | |
| 2008/0022921 A1 | 1/2008 | Sasaki et al. | |

FOREIGN PATENT DOCUMENTS

| | | |
|---|---|---|
| EP | 1557870 A2 * | 7/2005 |
| EP | 1775356 A2 | 4/2007 |
| EP | 1837421 A2 | 9/2007 |
| JP | 2003-238296 | 8/2003 |
| JP | 2003-292400 | 10/2003 |
| JP | 2003-313098 | 11/2003 |

(Continued)

OTHER PUBLICATIONS

Aoki et al, single crystal growth of GaN by the temperature gradient Na FLux method, 2004, Journal of crystal growth, 266, pp. 461-466.*

(Continued)

*Primary Examiner* — Melvin C Mayes
*Assistant Examiner* — Stefanie Cohen
(74) *Attorney, Agent, or Firm* — Cooper & Dunham LLP

(57) ABSTRACT

A crystal producing apparatus includes a crystal forming unit and a crystal growing unit. The crystal forming unit forms a first gallium nitride (GaN) crystal by supplying nitride gas into melt mixture containing metal sodium (Na) and metal gallium (Ga). The first GaN crystal is sliced and polished to form GaN wafers. The crystal growing unit grows a second GaN crystal on a substrate formed by using a GaN wafer, by the hydride vapor phase epitaxy method, thus producing a bulked GaN crystal.

19 Claims, 19 Drawing Sheets

FOREIGN PATENT DOCUMENTS

| | | |
|---|---|---|
| JP | 2004-168650 | 6/2004 |
| JP | 2004-189590 | 7/2004 |
| JP | 2004-224600 | 8/2004 |
| JP | 3631724 | 12/2004 |
| JP | 2005-236261 | 9/2005 |
| JP | 2005-350291 | 12/2005 |
| JP | 3788037 | 4/2006 |
| JP | 3966682 | 6/2007 |
| WO | WO2005/121415 A1 | 12/2005 |

OTHER PUBLICATIONS

Bockowski et al, growth and doping of GaN and AlN single crystals under high nitrgoen pressure, 2001, cryst. res. technol., 36, pp. 771-787.*

Roskowski et al, reduction in dislocation density and strain in GaN thin films grown via maskless pendeo- epitaxy, 2002, optpelectronics review, 10, pts, 261-270.*

Dec. 18, 2007 European search report in connection with corresponding European patent application No. EP 07 25 3900.

Jul. 12, 2011 Japanese official action in connection with a counterpart Japanese patent application.

Jan. 20, 2012 Japanese official action in connection with a counterpart Japanese patent application.

Jun. 8, 2012 Japanese official action in connection with a counterpart Japanese patent application.

* cited by examiner

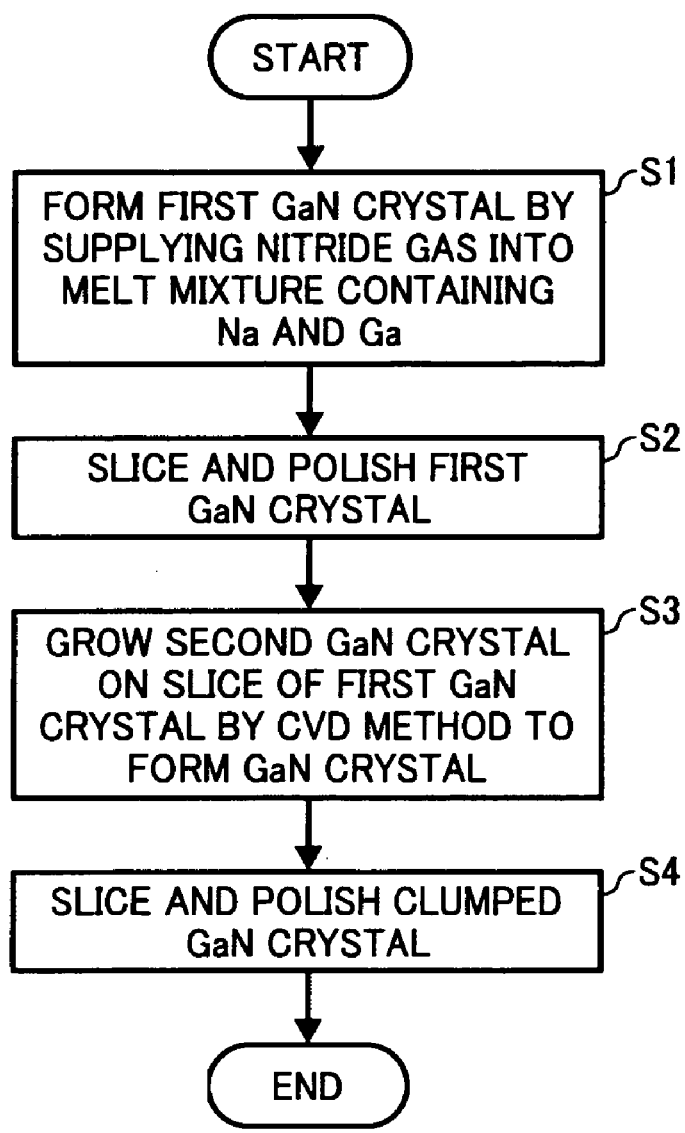

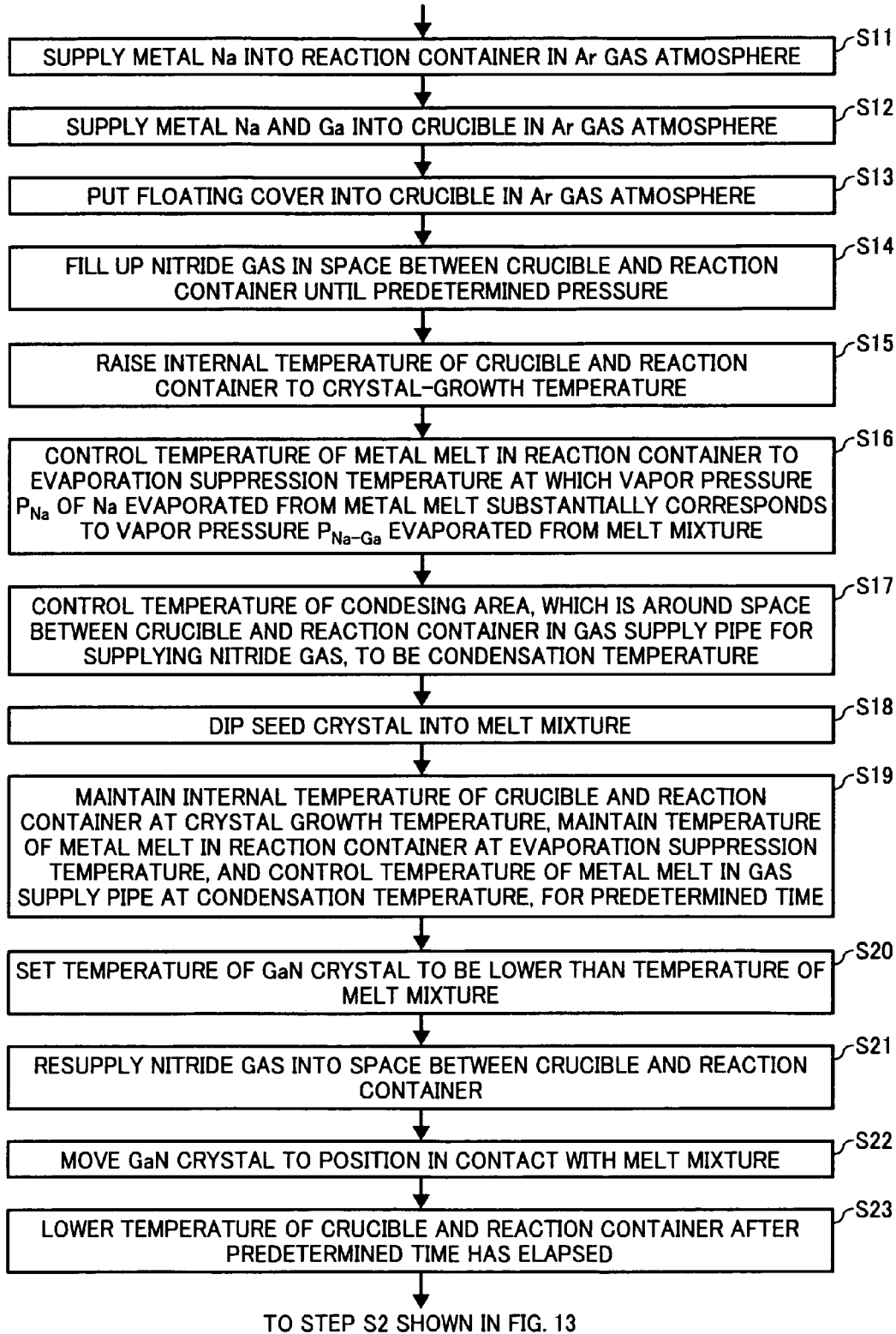

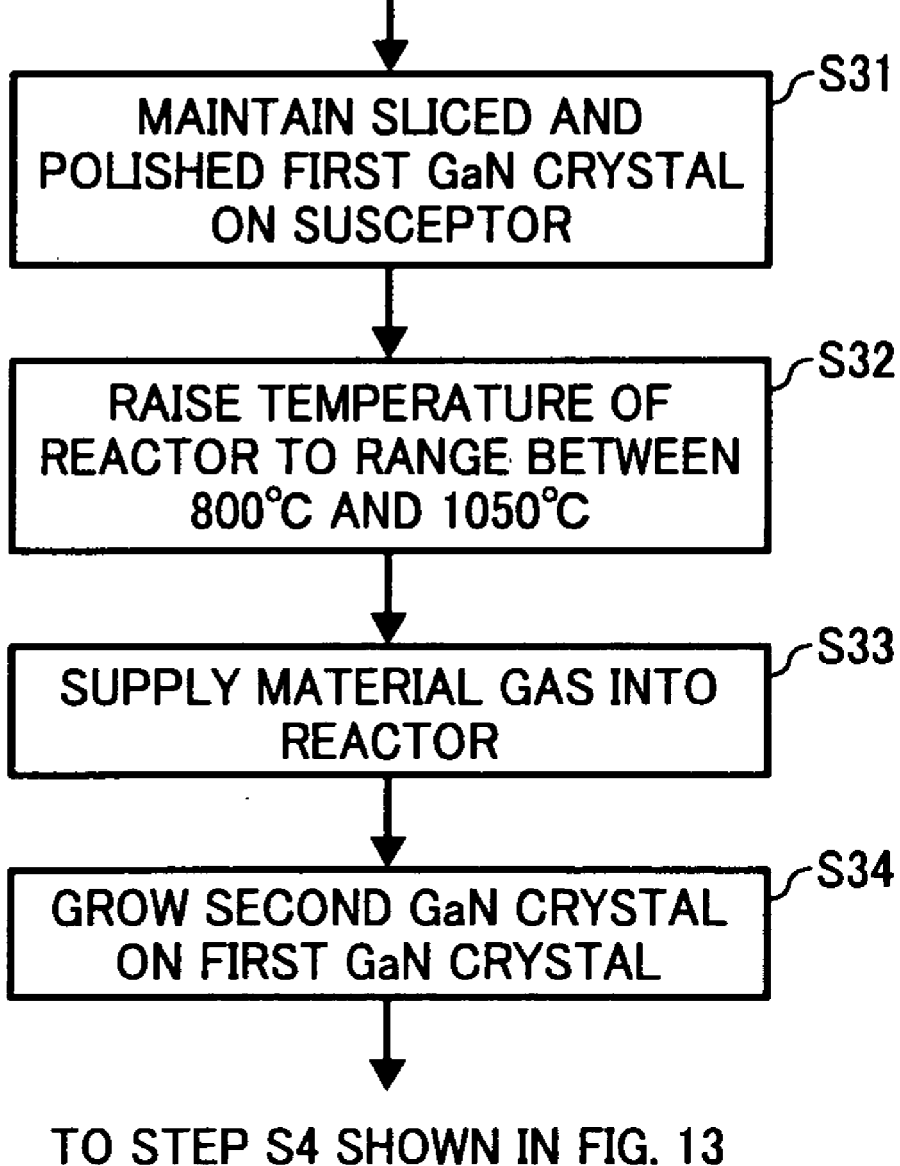

CRYSTAL PRODUCING APPARATUS, CRYSTAL PRODUCING METHOD, SUBSTRATE PRODUCING METHOD, GALLIUM NITRIDE CRYSTAL, AND GALLIUM NITRIDE SUBSTRATE

CROSS-REFERENCE TO RELATED APPLICATIONS

The present application claims priority to and incorporates by reference the entire contents of Japanese priority documents, 2006-270363 filed in Japan on Oct. 2, 2006 and 2007-198607 filed in Japan on Jul. 31, 2007.

BACKGROUND

1. Technical Field

This disclosure relates to a technology for producing a gallium nitride (GaN) crystal and a GaN substrate.

2. Description of the Related Art

Indium gallium aluminum (InGaAln)-based devices (group-III nitride semiconductor) are popularly used as ultraviolet light sources, purple light sources, blue light sources, or green light sources. Such group-III nitride semiconductor devices are typically formed on a substrate made of sapphire or silicon carbide (SiC) by metalorganic chemical vapor deposition (MOCVD) method or molecular beam epitaxy (MBE) method.

However, there is considerable difference between the coefficients of thermal expansion and the lattice constants of the substrate, which is made of sapphire or SiC, and the group-III nitride semiconductor. Such differences in the physical properties of the substrate and the group-III nitride semiconductor result in causing crystal defects (imperfections) in the group-III nitride semiconductor. If the group-III nitride semiconductor has crystal defects, performance of the device, such as a light-emitting device, made from the group-III nitride semiconductor degrades, e.g., device lifetime is shortened, large driving power is necessary, and the like.

Some of the conventional light emitting devices are made from a conducting substrate so that it was possible to obtain an electrode from such a conducting substrate. However, because sapphire is insulating, it is difficult to obtain an electrode from such an insulating substrate, requiring obtaining an electrode from a group-III nitride semiconductor. To obtain an electrode from a group-III nitride semiconductor, a device needs to be large, resulting in increasing necessary costs. Furthermore, if the device size increases, the substrate may warp because of the differences in the physical properties of the sapphire substrate and the group-III nitride semiconductor.

In a group-III nitride semiconductor device formed on a sapphire substrate, separation of chips by use of cleavages is difficult, so that it is difficult to obtain a desired resonator facet for a laser diode (LD). For counteracting above problems, in one approach, the resonator facet is formed by the dry etching method, or the method of separating a sapphire substrate in a manner similar to cleavage after polishing the sapphire substrate to make it as thick as 100 micrometers ($\mu$m) or less. In this approach, however, it is difficult to form a resonator facet and to conduct chip separation in a single process, unlike a process for forming a conventional LD. As a result, manufacturing costs increase due to the necessity of extra processes.

Another approach for reducing crystal defects is to selectively grow a group-III nitride semiconductor on a sapphire substrate in a longitudinal direction. Although the occurrence of crystal defects can be reduced in this approach, it is still difficult to solve problems related to insulation properties or cleavage of a sapphire substrate.

In still another approach, the substrate is made of gallium nitride (GaN). In other words, the substrate is made of the same material as the crystal grown on the substrate. For example, Japanese Patent No. 3788037 discloses a technology for producing a GaN substrate. The GaN substrate is produced by growing a GaN crystal on a gallium arsenic (GaAs) substrate by hydride vapor phase epitaxy (HVPE) method, and then, slicing grown GaN crystal.

However, the GaN crystal is formed using coalescence and bending of dislocation to reduce the occurrence of dislocations. Therefore, it is difficult to obtain desired flatness on a surface of a GaN crystal, resulting in making it difficult to produce a bulked GaN crystal in desired quality with less defect density.

Furthermore, when a GaN crystal is polished and sliced, mechanical damage and etching easily occurs in a crystal grain boundary or a region of dislocation. Thus, it is difficult to produce a wafer in desired quality with preferable flatness of its surface.

BRIEF SUMMARY

According to an aspect of the present invention, there is provided an apparatus that produces a group-III nitride crystal. The apparatus includes a crystal growing unit that grows by vapor phase epitaxy method a second nitride crystal on a first group-III nitride crystal group-III that is formed by flux method.

According to another aspect of the present invention, there is provided a method of producing a group-III nitride crystal. The method includes growing a second group-III nitride crystal by vapor phase epitaxy method on a first group-III nitride crystal that is formed by flux method.

According to still another aspect of the present invention, there is provided a gallium nitride crystal in bulks. The gallium nitride crystal includes a first gallium nitride crystal formed by flux method; and a second gallium nitride crystal grown on the first gallium nitride crystal.

The above and other aspects, features, advantages and technical and industrial significance of this disclosure will be better understood by reading the following detailed description of presently preferred embodiments of the invention, when considered in connection with the accompanying drawings.

BRIEF DESCRIPTION OF THE DRAWINGS

FIG. 13 is a flowchart for explaining a method of producing a GaN crystal by using the crystal producing apparatus shown in FIG. 1;

FIG. 14 is a flowchart for explaining detailed procedures at step S1 shown in FIG. 13;

FIG. 15 is a flowchart for explaining detailed procedures at step S3 shown in FIG. 13;

DETAILED DESCRIPTION OF THE PREFERRED EMBODIMENTS

Figure 1:
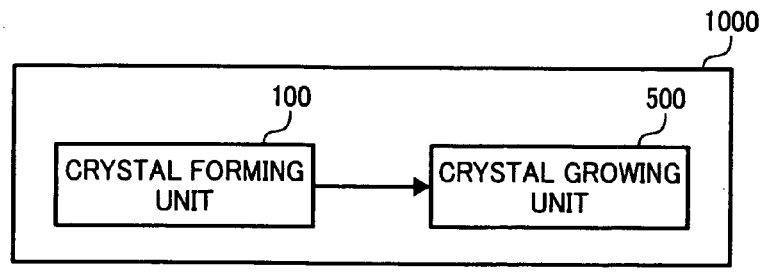
FIG. 1 is a block diagram of a crystal producing apparatus according to an embodiment of the present invention.

Exemplary embodiments of the present invention are explained in detail below with reference to the accompanying drawings. Same reference numerals are assigned to the same or substantially the same units, members, portions, and the like, and explanations thereof are omitted.

FIG. 1 is a schematic diagram of a crystal producing apparatus 1000 that produces a bulked gallium nitride (GaN) crystal according to an embodiment of the present invention. The crystal producing apparatus 1000 includes a crystal forming unit 100 and a crystal growing unit 500. The crystal forming unit 100 forms a GaN crystal by supplying nitride gas into melt mixture containing metal sodium (Na) and metal gallium (Ga). In other words, the crystal forming unit 100 forms a GaN crystal by the flux method. A GaN crystal formed by the crystal forming unit 100 will be called "a first GaN crystal" for convenience of explanation.

The crystal growing unit 500 grows a GaN crystal on the first GaN crystal by vapor phase epitaxy method. The GaN crystal grown on the first GaN crystal will be called "a second GaN crystal" for convenience of explanation.

Figure 2:
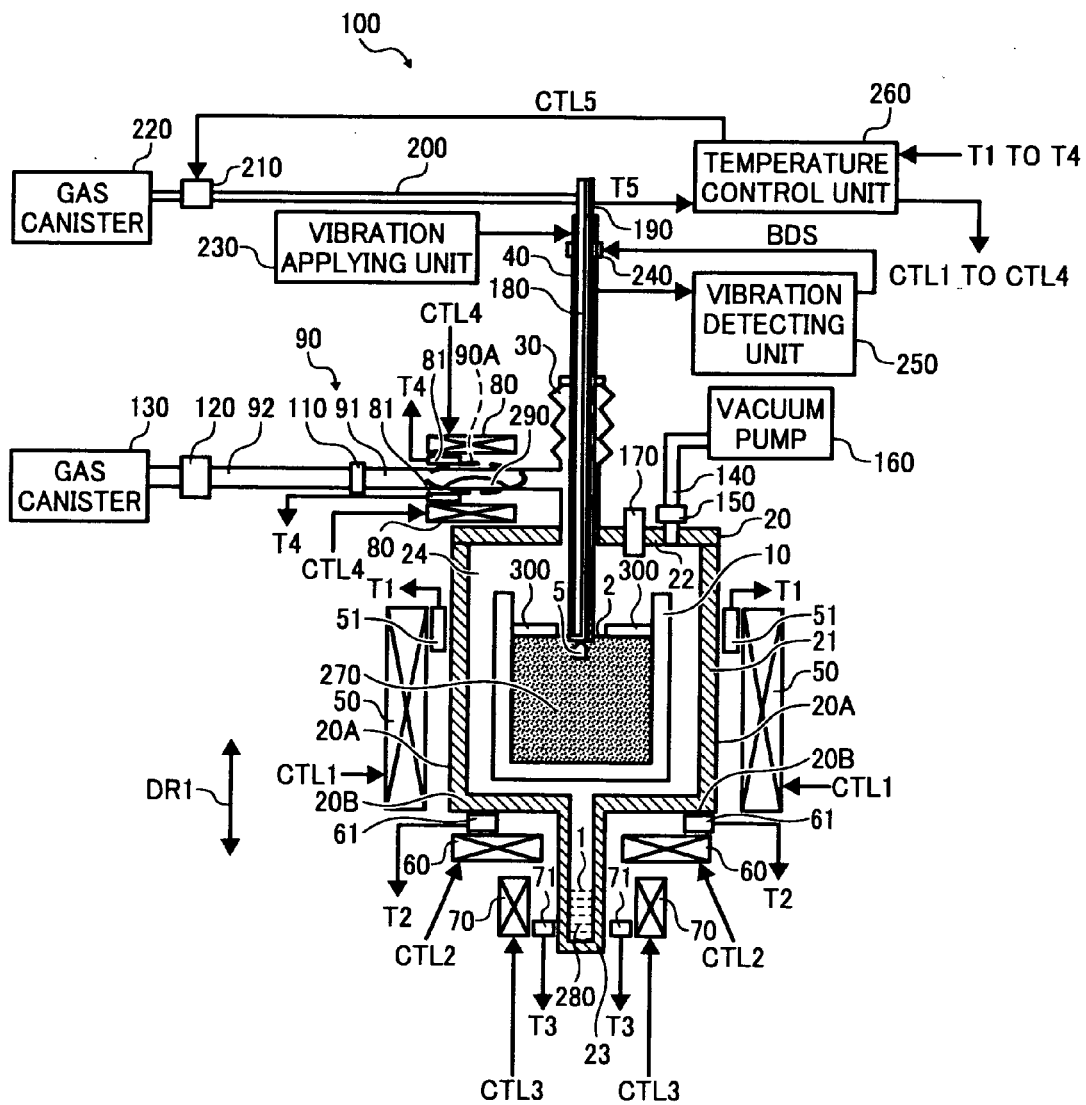
FIG. 2 is a schematic diagram of a crystal forming unit shown in FIG. 1.

As shown in FIG. 2, the crystal forming unit 100 includes a crucible 10; a reaction container 20; a bellows 30; a supporting unit 40; heating units 50, 60; temperature sensors 51, 61, 71, 81; heater/coolers 70, 80; gas supply pipes 90, 200; valves 110, 150; a pressure regulator 120; gas canisters 130, 220; an exhaust pipe 140; a vacuum pump 160; a pressure sensor 170; a pipe 180; a thermocouple 190; a flowmeter 210, a vibration applying unit 230; a shifting mechanism 240; a vibration detecting unit 250; a temperature control unit 260; and a floating cover 300.

Nitride gas is filled in each of the gas canisters 130 and 220.

The crucible 10 is a container of which peripheral portion is in a circular shape and made of boron nitride (BN) or austenite-based stainless copper (SUS316L). The crucible 10 stores therein melt mixture 270 containing metal Na and metal Ga.

The reaction container. 20 encloses the crucible 10. In other words, the crucible 10 is placed inside the reaction container 20. The reaction container 20 includes a body portion 21, a cover portion 22, and a melt reservoir 23. Each of the body portion 21, the cover portion 22, and the melt reservoir 23 is made of SUS316L. The body portion 21 and the cover portion 22 are sealed together by metal O-ring. The melt reservoir 23 is arranged on a bottom portion of the body portion 21, and stores therein alkali metal melt 280.

The bellows 30 is connected to the cover portion 22 of the reaction container 20 in a gravity direction DR1. The bellows 30 holds the supporting unit 40 and blocks between an inside and an outside of the reaction container 20. Furthermore, the bellows 30 expands and contracts in accordance with a movement of the supporting unit 40 in the gravity direction DR1.

The heating unit 50 surrounds a peripheral surface 20A of the reaction container 20. The heating unit 50 includes a heater (not shown) and a current source (not shown). In the heating unit, the current source supplies current to the heater in response to a control signal CTL1 received from the temperature control unit 260. When current flows in the heater, the crucible 10 and the reaction container 20 are heated.

The heating unit 60 is arranged near a bottom surface 20B of the reaction container 20. The heating unit 60 includes a heater (not shown) and a current source (not shown). In the heating unit 60, the current source supplies current to the heater in response to a control signal CTL2 received from the temperature control unit 260. When current flows in the heater, the crucible 10 and the reaction container 20 are heated. The heating units 50 and 60 heat the crucible 10 and the reaction container 20 to a crystal growth temperature.

The temperature sensor 51 is arranged near the heating unit 50. The temperature sensor 51 detects a temperature T1 of the heater in the heating unit 50, and outputs a signal indicative of the detected temperature T1 to the temperature control unit 260.

The temperature sensor 61 is arranged near the heating unit 60. The temperature sensor 61 detects a temperature T2 of the heater in the heating unit 50, and outputs a signal indicative of the detected temperature T2 to the temperature control unit 260.

The heater/cooler 70 surrounds the melt reservoir 23. The heater/cooler 70 includes a heating member (not shown) and a cooling member (not shown). The heating member includes a heater (not shown) and a current source (not shown). The current source supplies current to the heater whereby the heater heats the melt reservoir 23. The cooling member includes an air blower (not shown) that blows cool air to the melt reservoir 23 thereby cooling the melt reservoir 23. The heater/cooler 70 can heat the melt reservoir 23 to an evaporation suppression temperature, or can cool the melt reservoir 23 to a condensation temperature in response to a control signal CTL3 received from the temperature control unit 260. The evaporation suppression temperature is a temperature at which vapor pressure $P_{Na-Ga}$ of metal Na evaporated from the melt mixture 270 substantially corresponds to vapor pressure $P_{Na}$ of metal Na evaporated from the alkali metal melt 280. The condensation temperature is a temperature at which metal Na vapor is condensed to be metal melt.

The heater/cooler 80 surrounds a condensing area 90A of the gas supply pipe 90. The heater/cooler 80 includes a heating member (not shown) and a cooling member (not shown). The heating member includes a heater (not shown) and a current source (not shown). The current source supplies current to the heater whereby the heater heats the condensing area 90A. The cooling member includes an air blower (not shown) that blows cool air thereby cooling the condensing area 90A. The heater/cooler 80 can cool the condensing area 90A to the condensation temperature, or can heat the condensing area 90A to an evaporation acceleration temperature in response to a control signal CTL4 received from the temperature control unit 260. The evaporation acceleration temperature is a temperature at which metal Na is transported to a different area by chemical vapor transport.

The temperature sensor 71 is arranged near the heater/cooler 70. The temperature sensor 71 detects a temperature (T3) of either the heating member or the cooling member of the heater/cooler 70, and outputs the detected temperature T3 to the temperature control unit 260.

The temperature sensor 81 is arranged near the heater/cooler 80. The temperature sensor 81 detects a temperature (T4) of either the heating member or the cooling member of the heater/cooler 80, and outputs the detected temperature T4 to the temperature control unit 260.

The gas supply pipe 90 includes gas supply pipes 91 and 92. The gas supply pipe 90 supplies nitride gas from the gas canister 130 into the reaction container 20 via via the pressure regulator 120 and alkali metal melt 290.

The gas supply pipe 91 includes the condensing area 90A. One end of the gas supply pipe 91 communicates with the bellows 30, and the other end communicates with the gas supply pipe 92 via the valve 110.

One end of the gas supply pipe 92 communicates with the gas supply pipe 91 via the valve 110, and the other end communicates with the gas canister 130.

The valve 110 controls flow of nitride gas in the gas supply pipe 90. In other words, the valve 110 allows or does not allow flow of the nitride gas from the gas supply pipe 92 to the gas supply pipe 91. Thus, the valve 110 is configured to separate the gas supply pipe 90 into the gas supply pipes 91 and 92, and to connect the gas supply pipes 91 and 92 with each other.

The pressure regulator 120 is arranged in the gas supply pipe 92 near the gas canister 130. The pressure regulator 120 regulates at a predetermined pressure the pressure of nitride gas flowing in the gas supply pipe 92 from the gas canister 130.

One end of the exhaust pipe 140 communicates with the reaction container 20, and the other end communicates with the vacuum pump 160. Thus, the exhaust pipe 140 conveys gas from the reaction container to the vacuum pump 160.

The valve 150 is arranged in the exhaust pipe 140. The valve 150 controls flow of gas from the reaction container 20 to the vacuum pump 160.

The vacuum pump 160 sucks gas from the reaction container 20 via the exhaust pipe 140 and the valve 150 to form a vacuum in the reaction container 20.

The pressure sensor 170 is attached to the reaction container 20, and detects pressure inside the reaction container 20.

One end of the gas supply pipe 200 communicates with the pipe 180, and the other end communicates with the gas canister 220. The flowmeter 210 is arranged in the gas supply pipe 200. Thus, the gas supply pipe 200 supplies nitride gas from the gas canister 220 to the pipe 180 via the flowmeter 210.

The flowmeter 210 adjusts the flow rate of the nitride gas flowing in the gas supply pipe 200 in response to a control signal CTL5 received from the temperature control unit 260.

The alkali metal melt 280 is metal Na melt, and stored in the melt reservoir 23. The alkali metal melt 290 is metal Na melt, and stored in the condensing area 90A in the gas supply pipe 90.

The vibration applying unit 230 includes piezoelectric element or the like, and applies vibration having a predetermined frequency to the supporting unit 40.

The vibration detecting unit 250 includes an acceleration pick-up or the like. The vibration detecting unit 250 detects vibration of the supporting unit 40 and outputs to the shifting mechanism 240 a vibration detection signal BDS indicative of vibration information of the supporting unit 40.

Figure 3A:
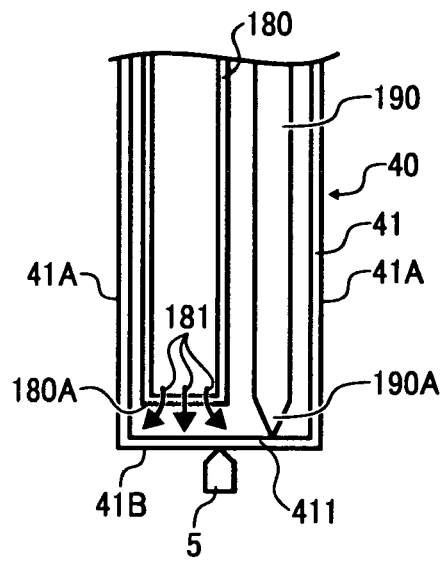
FIGS. 3A and 3B are enlarged views of a supporting unit, a pipe, and a thermocouple shown in FIG. 2.
Figure 3B:
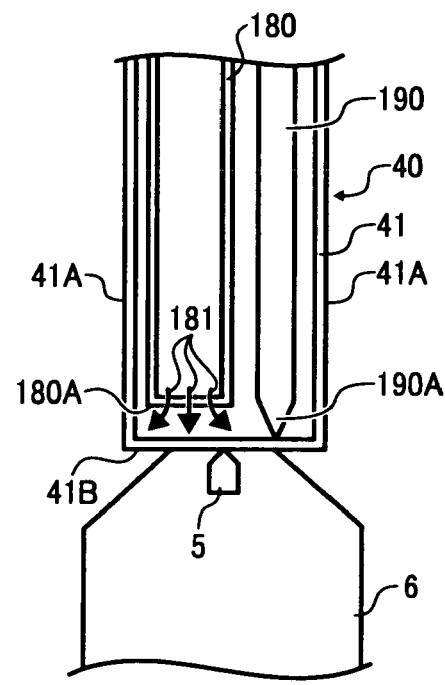

FIGS. 3A and 3B are enlarged views of parts of the supporting unit 40, the pipe 180, and the thermocouple 190.

The supporting unit 40 includes a cylinder member 41. One end of the cylinder member 41 is inserted into a space 24 inside the reaction container 20 via an opening portion (not shown) arranged on the cover portion 22. A seed crystal 5 is attached on a bottom surface 41B of the cylinder member 41. The supporting unit 40 supports a GaN crystal 6 (see FIG. 3B) grown on the one end of the cylinder member 41.

The pipe 180 conveys the nitride gas from the gas supply pipe 200, i.e., from the gas canister 220, through the inside of the supporting unit 40 to the reaction container 20 to cool the seed crystal 5 and the GaN crystal 6. A bottom surface 180A of the pipe 180 is arranged in such a manner that the bottom surface 180A faces the bottom surface 41B of the cylinder member 41. A plurality of holes 181 are formed on the bottom surface 180A of the pipe 180. Nitride gas supplied into the pipe 180 is blown to the bottom surface 41B of the cylinder member 41 through the holes 181. Nitride gas output to an inside of the cylinder member 41 is then output to an outside of the crystal forming unit 100 through an opening portion (not shown) of the cylinder member 41.

The thermocouple 190 is arranged inside the cylinder member 41 in such a manner that one end 190A of the thermocouple 190 is in contact with the bottom surface 41B of the cylinder, member 41. The thermocouple 190 detects a temperature T5 of each of the seed crystal 5 and the GaN crystal 6, and outputs the detected temperature T5 to the temperature control unit 260.

With such an arrangement, thermal conductivity between the GaN crystal 6 and the cylinder member 41 increases. As a result, the temperature T5 of the GaN crystal 6 can be accurately detected with the thermocouple 190, and the GaN crystal 6 can be appropriately cooled by nitride gas blown to the bottom surface 41B.

Returning to the explanation of FIG. 2, the shifting mechanism 240 is attached to the supporting unit 40 on an upper side of the bellows 30. The shifting mechanism 240 shifts up or down the supporting unit 40 so that the seed crystal 5 comes in contact with a gas-liquid interface 2 between the space 24 and the melt mixture 270 in response to the vibration detection signal BDS output from the vibration, detecting unit 250.

Figure 4:
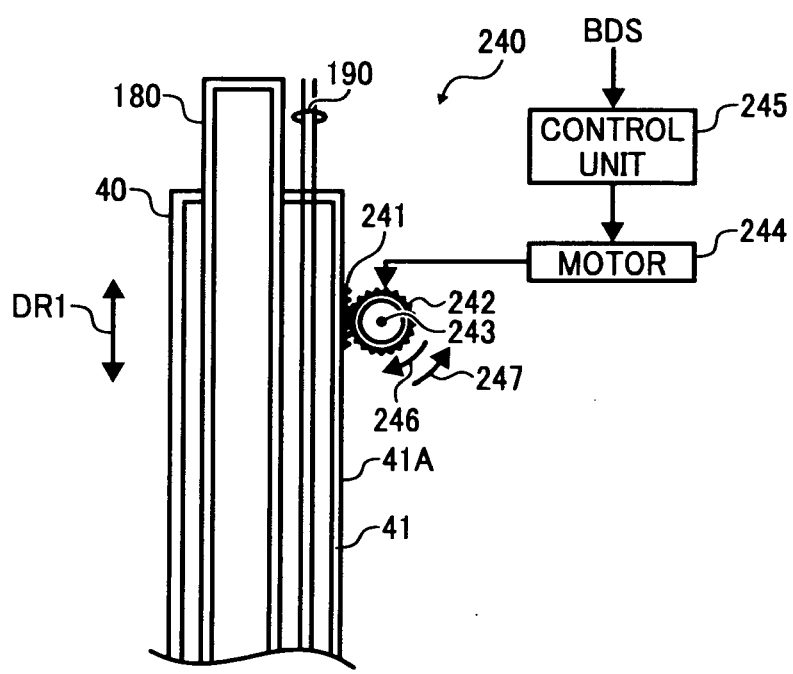
FIG. 4 is an enlarged view of a shifting mechanism shown in FIG. 2.

The shifting mechanism 240 includes, as shown in FIG. 4, a corrugated member 241, a gear 242, a shaft member 243, a motor 244, and a control unit 245. The corrugated member 241 has a substantially triangular cross-sectional shape, and is fixed onto a peripheral surface 41A of the cylinder member 41. The gear 242 is fixed onto, one end of the shaft member 243, and is engaged with the corrugated member 241. The other end of the shaft member 243 is coupled with a-axis (not shown) of the motor 244.

The motor 244 rotates the gear 242 in a direction represented by arrows 246 or 247 based on a control by the control unit 245. The control unit 245 controls the motor 244 to rotate the gear 242 based on the vibration detection signal BDS output from the vibration detecting unit 250.

When the gear 242 rotates in a direction represented by the arrow 246, the supporting unit 40 shifts upward in the gravity direction DR1. On the other hand, when the gear rotates in a direction represented by the arrow 247, the supporting unit 40 shifts downward in the gravity direction DR1. In other words, the supporting unit 40 shifts upward or downward in the gravity direction DR1 because of the rotation of the gear 242 in a direction represented by the arrows 246 or 247. A length of the corrugated member 241 in the gravity direction DR1 corresponds to a distance of movement of the GaN crystal 6 in an upward direction or a downward direction shifted by the supporting unit 40.

Figure 5:
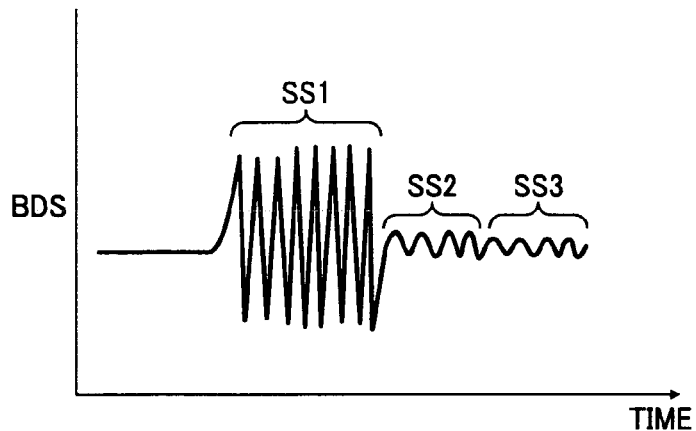
FIG. 5 is a timing chart of a vibration detection signal according to the embodiment.

FIG. 5 is an exemplary timing chart of the vibration detection signal BDS. The vibration detection signal BDS contains signal component SS1 when the supporting unit 40 is not in contact with the melt mixture 270, contains signal component SS2 when the supporting unit 40 is in contact with the melt mixture 270, and contains signal component SS3 when portion of the supporting unit 40 is dipped into the melt mixture 270.

When the supporting unit 40 is not in contact with the melt mixture 270, the supporting unit 40 largely vibrates due to vibration applied by the vibration applying unit 230, so that the vibration detection signal BDS contains the signal component SS1 with relatively large amplitude. On the other hand, when the supporting unit 40 is in contact with the melt mixture 270, the supporting unit 40 does not vibrate so much because of viscosity of the melt mixture 270 even when vibration is applied by the vibration applying unit 230. Therefore, in such a situation, the vibration detection signal BDS contains the signal component SS2 with relatively small amplitude. When portion of the supporting unit 40 or the GaN crystal 6 is dipped into the melt mixture 270, the supporting unit 40 or the GaN crystal 6 hardly vibrates because of viscosity of the melt mixture 270 even when vibration is applied by the vibration applying unit 230. Therefore, in such a situation, the vibration detection signal BDS contains the signal component SS3 with amplitude smaller than that of the signal component SS2.

Referring back to FIG. 4, the control unit 245 detects signal components of the vibration detection signal BDS upon receiving the vibration detection signal BDS from the vibration detecting unit 250. Upon detecting the signal component SS1, the control unit 245 controls the motor 244 to shift the supporting unit 40 downward in the gravity direction DR1 until the signal component SS1 changes to the signal component SS2 or SS3.

Specifically, upon detecting the signal component SS1, the control unit 245 controls the motor 244 to rotate the gear 242 in a direction represented by the arrow 247. The motor 244 rotates the gear 242 via the shaft member 243 in the direction represented by the arrow 247 based on a control by the control unit 245. As a result of the above control, the supporting unit 40 shifts downward in the gravity direction DR1.

When the signal component SS1 changes to the signal component SS2 or SS3, the control unit 245 controls the motor 244 to stop rotating the gear 242. The motor 244 stops rotating the gear 242 under the control of the control unit 245. As a result of the above control, the supporting unit 40 stops its shifting, so that the one end of the supporting unit 40 is in contact with the gas-liquid interface 2, or the one end is dipped into the melt mixture 270. On the other hand, upon receiving the vibration detection signal BDS containing the signal component SS2 or SS3, the control unit 245 controls the motor 244 to stop shifting the supporting unit 40.

As described above, the shifting mechanism 240 shifts the supporting unit 40 in the gravity direction DR1 based on the vibration detected by the vibration detecting unit 250 so that the one end of the supporting unit 40 is in contact with the surface of the melt mixture 270, or the one end of the supporting unit 40 is dipped into the melt mixture 270.

The floating cover 300 is made of boron nitride (BN) and the like, and arranged on a surface of the melt mixture 270 around the supporting unit 40. The floating cover 300 prevents evaporation of metal Na from the melt mixture 270.

Figure 6:
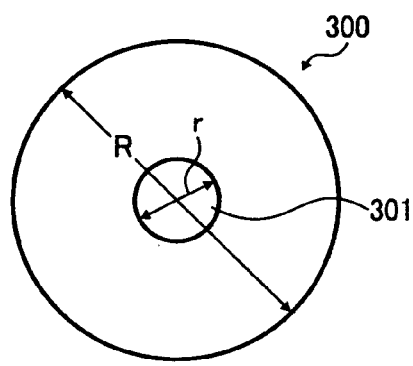
FIG. 6 is a plan view of a floating cover shown in FIG. 2.

FIG. 6 is a plan view of the floating cover 300. The floating cover 300 is in a torus shape. That is, the floating cover 300 has a hole 301 at the center. The floating cover 300 has an inner diameter r and an outer diameter R. The inner diameter r is such that a value α is added to a diameter of the supporting unit 40. The value α is such that corresponds to a clearance formed between the supporting unit 40 and the floating cover 300 for melting nitride gas with the melt mixture 270. The outer diameter R substantially corresponds to an inner diameter of the crucible 10.

The one end of the supporting unit 40 is maintained in contact with the surface of the melt mixture 270 or dipped in the melt mixture 270 via the hole 301.

The temperature control unit 260 generates the control signal CTL1 for heating the crucible 10 and the reaction container 20 to the crystal-growth temperature based on the temperature T1, and generates the control signal CTL2 for heating the crucible 10 and the reaction container 20 to the crystal-growth temperature based on the temperature T2. The temperature control unit 260 generates the control signal CTL3 for controlling a temperature of the melt reservoir 23 to an evaporation suppression temperature Tevc or a condensation temperature Tcoh based on the temperature T3. The temperature control unit 260 generates the control signal CTL4 for controlling a temperature of the condensing area 90A to the condensation temperature Tcoh or an evaporation acceleration temperature Tev based on the temperature T4. The temperature control unit 260 generates the control signal CTL5 for flowing nitride gas with a flow rate appropriate to change a temperature T5 of the seed crystal 5 or the GaN crystal 6 to be lower than a temperature of the melt mixture 270 around the seed crystal 5 based on the temperature T5.

The temperature control unit 260 outputs the control signal CTL1 to the heating unit 50, the control signal CTL2 to the heating unit 60the control signal CTL3 to the heater/cooler 70, and the control signal CTL4 to the heater/cooler 80. The temperature control unit 260 outputs the generated control signal CTL5 to the flowmeter 210.

Figure 7:
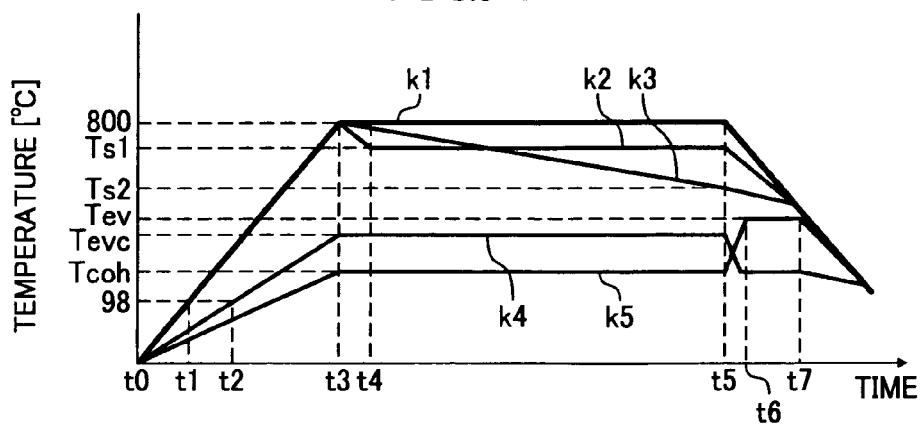
FIG. 7 is a timing chart of a temperature of each of a crucible, a reaction container, a melt reservoir, and a condensing area shown in FIG. 2.
Figure 8A:
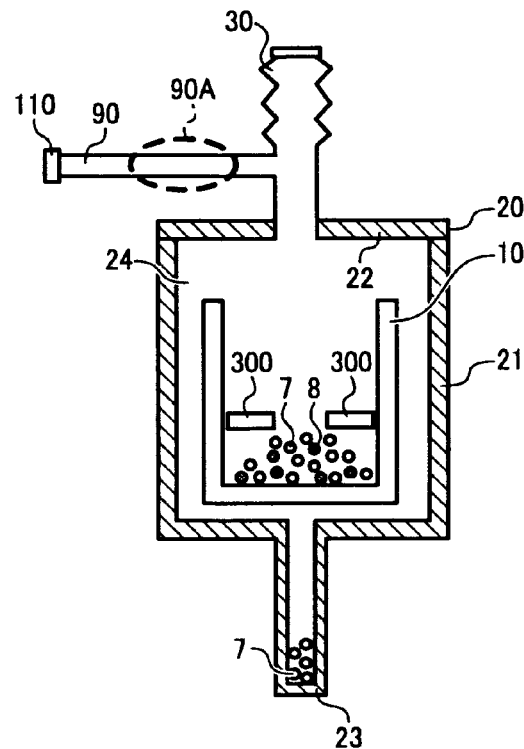
FIGS. 8A and 8B are schematic diagrams for explaining state variation in each of the crucible, the reaction container, the melt reservoir, and the condensing area between timings t1 and t3 shown in FIG. 7.
Figure 8B:
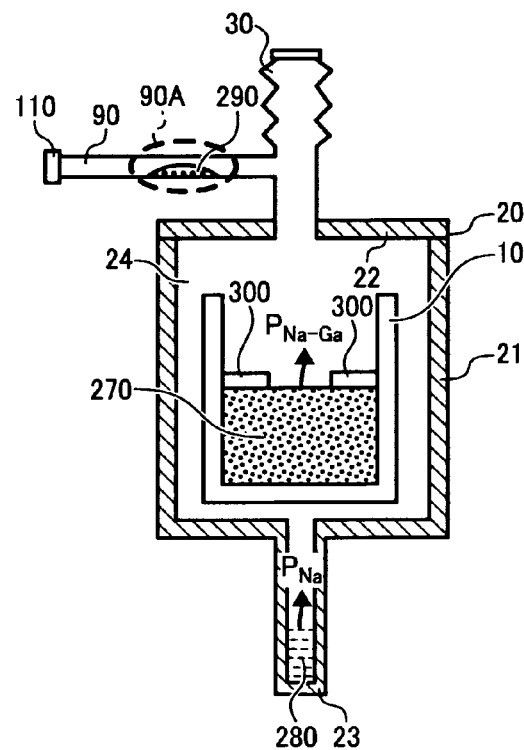

FIG. 7 is a timing chart of the temperature of each of the crucible 10, the reaction container 20, the melt reservoir 23, and the condensing area 90A. FIGS. 8A and 8B are schematic diagrams for explaining state variation in each of the crucible 10, the reaction container 20, the melt reservoir 23, and the condensing area 90A between timings t1 and t3 shown in FIG.

Figure 9:
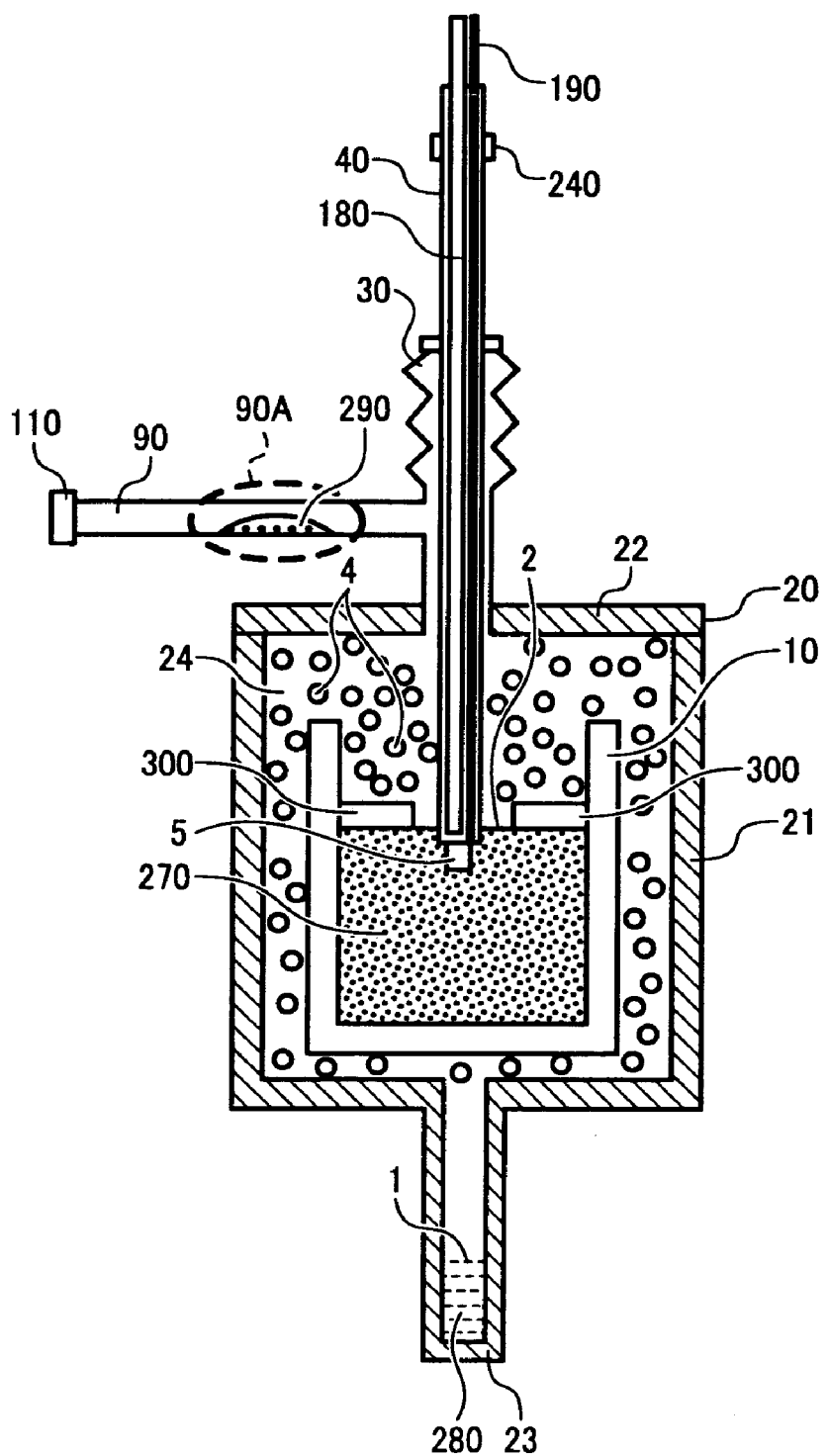
FIG. 9 is a schematic diagram for explaining state variation in each of the crucible and the reaction container at timing t3 shown in FIG. 7.
Figure 10:
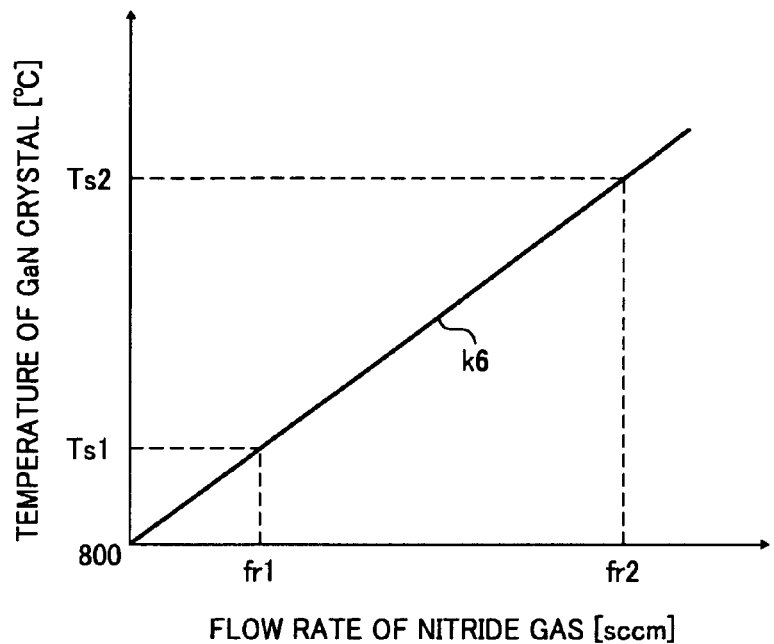
FIG. 10 is a graph for explaining a relation between temperature of a GaN crystal and flow rate of nitride gas according to the embodiment.

7. FIG. 9 is a schematic diagram for explaining state variation in each of the crucible 10 and the reaction container 20 at timing t3 shown in FIG. 7. FIG. 10 is a graph for explaining a relation between the temperature of the GaN crystal 6 and the flow rate of nitride gas according to the embodiment.

In the graph shown in FIG. 7, a curve k1 represents the combined temperature of the crucible 10 and the reaction container 20, curves k2 and k3 represent the temperatures of the GaN crystal 6, a curve k4 represents the temperature of the melt reservoir 23, and a curve k5 represents the temperature of the condensing area 90A.

The heating units 50 and 60 heat the crucible 10 and the reaction container 20 until timing t5 so that, as represented by the curve k1, the temperature of the crucible 10 and the reaction container 20 rises, and is maintained at 800° C. The heater/cooler 70 heats the melt reservoir 23 until timing t5 so that, as represented by the curve k4, the temperature of the melt reservoir 23 rises and is maintained at the evaporation suppression temperature Tevc. The heater/cooler 80 heats the condensing area 90A until timing t5 so that, as represented by the curve k5, the temperature of the condensing area 90A rises and is maintained at the condensation temperature Tcoh.

At timing t0, i.e., when the heating units 50 and 60 start heating the crucible 10 and the reaction container 20, as shown in FIG. 8A, metal Na 7 and metal Ga 8 are present in the crucible 10. On the other hand, at timing t0, i.e., when the heater/cooler 70 starts heating the melt reservoir 23 and the heater/cooler 80 starts heating the condensing area 90A, as shown in FIG. 8A, the metal Na 7 is present in the melt reservoir 23, while the metal Na 7 is not present in the condensing area 90A.

When the temperature of the crucible 10 and the reaction container 20 reaches 98° C. at timing t1, the metal Na 7 in the crucible 10 melts and mixes with the metal Ga 8 that has already melted at about 30° C. Subsequently, an intermetallic compound of Ga and Na is generated, so that the melt mixture 270 is generated by the intermetallic compound in the crucible 10 at 560° C. or higher. The temperature of the crucible 10 and the reaction container 20 as represented by the curve k1 in FIG. 7 reaches 800° C. at timing t3.

When the temperature of the melt reservoir 23 reaches 98° C. at timing t2, the metal Na 7 present in the melt reservoir 23 melts, and the alkali metal melt 280 is generated in the melt reservoir 23. Subsequently, a temperature of the melt reservoir 23 as represented by the curve k4 in FIG. 7 reaches the evaporation suppression temperature Tevc. The temperature of the condensing area 90A as represented by the curve k5 in FIG. 7 reaches the condensation temperature Tcoh at timing t3.

In the process of heating the crucible 10 and the reaction container 20 to 800° C. and heating the melt reservoir 23 to the evaporation suppression temperature Tevc, vapor pressure $P_{Na}$ of metal Na evaporated from the alkali metal melt 280 and vapor pressure $P_{Na-Ga}$ of metal Na evaporated from the melt mixture 270 gradually increase. The metal Na evaporated from the melt mixture 270 and/or the alkali metal melt 280 gets condensed in the condensing area 90A, which is at the condensation temperature Tcoh that is lower than temperatures of any one of the crucible 10, the reaction container 20, and the melt reservoir 23. As a result, the alkali metal melt 290 gets condensed in the condensing area 90A.

At timing t3, the vapor pressure $P_{Na-Ga}$ of alkali metal evaporated from the melt mixture 270 substantially corresponds to the vapor pressure $P_{Na}$ of alkali metal evaporated from the alkali metal melt 280 (see FIG. 8B). As a result, it is possible to suppress variation of mixture ratio between metal Na and metal Ga in the melt mixture 270 due to evaporation of metal Na from the melt mixture 270 and alkali metal melt 280.

At this point, when a temperature of the condensing area 90A is higher than a melting point of metal Na, and at which Na does not practically evaporates, it is possible to consider that diffusion of metal Na to a side of the valve 110 does not affect to mixture ratio of metal Na and metal Ga in the melt mixture 270. As a result, it is possible to suppress more variation of mixture ratio between metal Na and metal Ga in the melt mixture 270. The temperature at which Na does not practically evaporates is, i.e., in a range between 200° C. and 300° C. The vapor pressure of Na at 200° C. is about $1.8 \times 10^{-2}$ Pa, while the vapor pressure of Na at 300° C. is about 1.8 Pa. Although diffusion of metal Na may occur due to evaporation even at a temperature higher than 300° C., it is possible to suppress variation in the mixture ratio of metal Na and metal Ga in the melt mixture 270. Therefore, the condensation temperature Tcoh is preferably set in a temperature range between 200° C. and 300° C.

Because the floating cover 300 is arranged on the surface of the melt mixture 270, evaporation of metal Na from the melt mixture 270 can be suppressed when a timing, at which Na evaporates from the melt mixture 270 in the crucible 10, has passed. Therefore, it is possible to suppress more variation in the mixture ratio of metal Na and metal Ga in the melt mixture 270.

Nitride gas 4 of which pressure is regulated by the pressure regulator 120 is supplied into the space 24 via the gas supply pipe 90 (see FIG. 9).

At timing t3, at which the temperature of the crucible 10 and the reaction container 20 reaches 800° C., the shifting mechanism 240 shifts the supporting unit 40 up or down based on the vibration detection signal BDS output from the vibration detecting unit 250 until the one end of the supporting unit 40 comes contact with the melt mixture 270 as explained above.

When temperature of the crucible 10 and the reaction container 20 is about 800° C., which is a high-temperature state, the nitride gas 4 in the space 24 is absorbed in the melt mixture 270 through medium of metal Na. At this point, density of nitride or density of group-III nitride in the melt mixture 270 is densest around the gas-liquid interface 2 between the space 24 and the melt mixture 270. Therefore, the GaN crystal 6 grows from the seed crystal 5.

When nitride gas is not supplied into the pipe 180, the temperature T5 is kept at 800° C., which is the same as that of the melt mixture 270. However, the seed crystal 5 or the GaN crystal 6 is cooled by supplying nitride gas into the pipe 180, and the temperature T5 is set lower than that of the melt mixture 270 to increase degree of supersaturation of nitride or group-III nitride in the melt mixture 270 around the seed crystal 5 or the GaN crystal 6.

Specifically, the temperature T5 is maintained at a temperature Ts1, which is lower than 800° C., as represented by the curve k2 in FIG. 7, after timing t3. The temperature Ts1 is, e.g., 790° C. A process of setting the temperature T5 to the temperature Ts1 is explained below.

When the temperatures T1 and T2, which are respectively detected by the temperature sensors 51 and 61, reach $800+\alpha°$ C., i.e., a temperature of a heater included in each of the heating units 50 and 60 when the temperature of the crucible 10 and the reaction container 20 is set at 800° C., the temperature control unit 260 generates the control signal CTL5 for flowing nitride gas with flow rate for setting the temperature T5 to the temperature Ts1, and outputs the control signal CTL5 to the flowmeter 210.

The flowmeter 210 causes nitride gas to flow from the gas canister 220 to the pipe 180 via the gas supply pipe 200 at such a flow rate that the temperature T5 is maintained at the temperature Ts1. The temperature T5 decreases from 800° C. substantially in proportion to the flow rate of nitride gas. When the flow rate of nitride gas reaches flow rate fr1 standard cubic centimeters per minute (sccm), the temperature T5 reaches the temperature Ts1 (see FIG. 10).

The flowmeter 210 causes nitride gas to flow into the pipe 180 at flow rate fr1. Nitride gas supplied to the pipe 180 is blown to the bottom surface 41B of the cylinder member 41 from the holes 181 of the pipe 180.

Accordingly, the seed crystal 5 or the GaN crystal 6 is cooled via the bottom surface 41B. As the seed crystal 5 or the GaN crystal 6 cools, the temperature T5 drops to the temperature Ts1 at timing t4. Subsequently, the temperature T5 is maintained at the temperature Ts1 until timing t5.

Each of the temperatures T1 and T2 of the heater in the heating units 50 and 60 has a predetermined difference α° C. from a temperature of the melt mixture 270. When the temperature T5 of the GaN crystal 6 drops below 800° C., the temperature control unit 260 controls the heating units 50 and 60 using the control signals CTL1 and CTL2, so that the temperatures T1 and T2 reach 800+α° C.

The temperature T5 of the seed crystal 5 or the GaN crystal 6 is preferably controlled to decrease, as represented by the curve k3 shown in FIG. 7, after timing t3. In other words, the temperature T5 decreases from 800° C. to a temperature Ts2, which is lower than the temperature Ts1, in a period from timing t3 to timing t5. At this point, the flowmeter 210 increases flow rate of nitride gas to be flown, as represented by the curve k6 shown in FIG. 10, from zero to flow rate fr2, which is larger than the flow rate fr1, based on the control signal CTL5 output from the temperature control unit 260. When the flow rate of nitride gas reaches the flow rate fr2, the temperature T5 is set to the temperature Ts2, e.g., 750° C., which is lower than the temperature Ts1.

As described above, by gradually increasing a difference between a temperature (i.e., 800° C.) of the melt mixture 270 and the temperature T5 of the GaN crystal 6, a degree of supersaturation of nitride or group-III nitride in the melt mixture 270 around the GaN crystal 6 gradually increases, resulting in continuing crystal growth of the GaN crystal.

Figure 11:
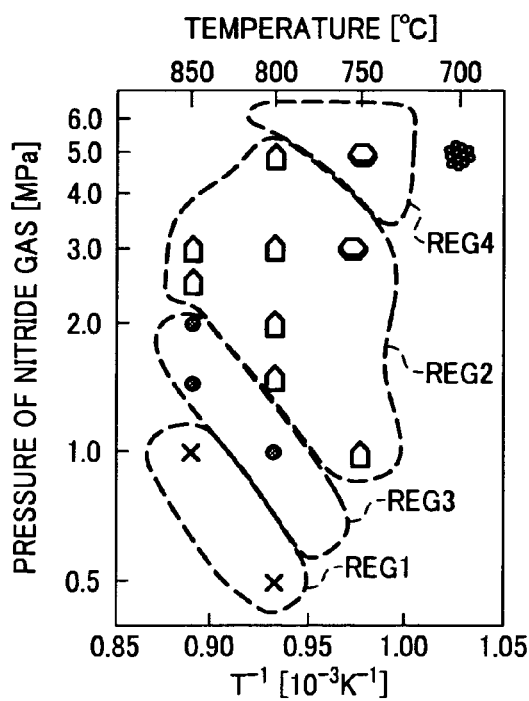
FIG. 11 is a schematic diagram for explaining a relation between pressure of nitride gas and temperature of melt mixture for growing a GaN crystal according to the embodiment.

FIG. 11 is a schematic diagram for explaining a relation between pressure of nitride gas (hereinafter, "nitride gas pressure") and temperature of the melt mixture 270 for growing GaN crystal according to the embodiment. In FIG. 11, the temperature is represented on the horizontal axis and pressure is represented on the vertical axis. On the graph, a region REG1 represents an area in which the GaN crystal 6 melts. A region REG2 represents an area in which a number of self-nucleation growth is conducted on an inner bottom surface or an inner side surface of the crucible 10 in contact with the melt mixture 270, and the GaN crystal 6 in a columnar shape grown in a direction of c-axis (<0001>) is formed. A region REG3 represents an area in which the GaN crystal 6 is grown from the seed crystal 5. A region REG4 represents an area in which a number of self-nucleation growth is conducted and the GaN crystal 6 in a plate shape grown from the c-plane is formed, similar to that of the region REG2.

The GaN crystal 6 is grown at the temperature-pressure conditions in the region REG2 or REG4, while the GaN crystal 6 is grown from the seed crystal 5 at the temperature-pressure conditions in the region REG3.

Referring back to FIG. 7, when crystal growth of the GaN crystal 6 is completed, i.e., at timing t5, the heating units 50 and 60 stop heating the crucible 10 and the reaction container 20. Accordingly, the temperature of the crucible 10 and the reaction container 20 drops below 800° C. as represented by the curve k1, and the temperature T5 of the GaN crystal 6 drops below the temperature Ts1 or Ts2.

On the other hand, the heater/cooler 70 cools the melt reservoir 23 as represented by the curve k4. The temperature of the melt reservoir 23 is maintained at the condensation temperature Tcoh during a period from timing t6 to timing t7. The heater/cooler 80 heats the condensing area 90A as represented by the curve k5. The temperature of the condensing area 90A is maintained at the evaporation acceleration temperature Tev during a period from timing t6 to timing t7. The evaporation acceleration temperature Tev is a temperature at which the alkali metal melt 290 is transported from the condensing area 90A to different areas by chemical vapor transport.

During a period from timing t6 to timing t7, a temperature of the melt reservoir 23 is maintained at the condensation temperature Tcoh, while a temperature of the condensing area 90A is maintained at the evaporation acceleration temperature Tev. As a result, the alkali metal melt 290 evaporates and flows from the condensing area 90A to the melt reservoir 23 by chemical vapor transport.

At timing t7, the alkali metal melt 290 is not present in the condensing area 90A. Because the valve 110 is in closed state, vapor containing metal Na evaporated from the alkali metal melt 290 does not diffuse toward the pressure regulator 120 while the alkali metal melt 290 flows from the condensing area 90A to the melt reservoir 23.

At timing t7, when the alkali metal melt 290 has completely flown to the melt reservoir 23, the heater/cooler 70 cools the melt reservoir 23 and the heater/cooler 80 cools the condensing area 90A. Accordingly, the crucible 10, the reaction container 20, the melt reservoir 23, and the condensing area 90A are cooled to the room temperature after timing t7.

Figure 12:
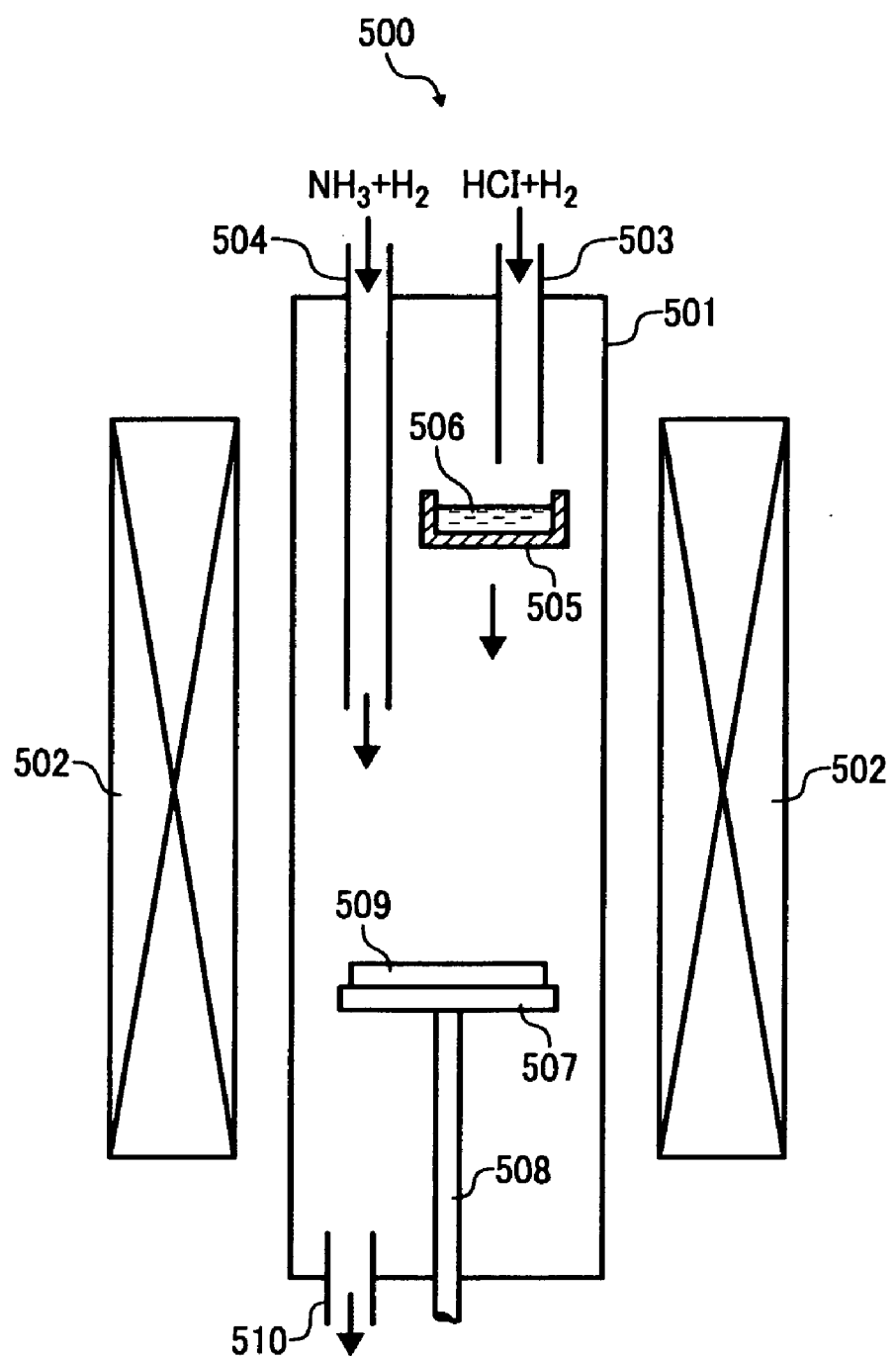
FIG. 12 is a schematic diagram of a crystal growing unit shown in FIG. 1.

The crystal growing unit 500 includes, as shown in FIG. 12, a reactor 501, a heater 502, gas introduction pipes 503 and 504, a Ga storage unit 505, a susceptor 507, a shaft 508, and a gas exhaust pipe 510.

The reactor 501 is substantially cylindrical. The heater 502 is also cylindrical, and it is arranged around the reactor 501. The heater 502 heats the reactor 501 to a temperature between 800° C. and 1050° C.

The gas introduction pipes 503 and 504 are arranged on a top portion of the reactor 501. One end of the gas introduction pipe 503 is arranged above the Ga storage unit 505. One end of the gas introduction pipe 504 is arranged in a position between a bottom surface of the Ga storage unit 505 and a, top surface of the susceptor 507.

The gas introduction pipe 503 introduces hydrogen chloride (HCl) and hydrogen ($H_2$) (hereinafter, "HCl +$H_2$") into the reactor 501, and blows HCl+$H_2$ to the Ga storage unit 505. The gas introduction pipe 504 introduces ammonia ($NH_3$) and hydrogen ($H_2$) (hereinafter, "$NH_3$+$H_2$") into the reactor 501, and emits $NH_3$+$H_2$ to an outside of the gas introduction pipe 504 in a downward side of the Ga storage unit 505.

The Ga storage unit 505 is arranged inside the reactor 501, and it stores therein Ga melt 506. The susceptor 507 is attached to one end of the shaft 508. The susceptor 507 holds a GaN crystal 509 in wafer shape, and rotates or shifts up or down the GaN crystal 509 in accordance with the rotation and shifting of the shaft 508.

The shaft 508 is attached to a bottom of the reactor 501 in rotatable and up-down movable manner. The shaft 508 supports the susceptor 507 and rotates and shifts up or down the susceptor 507.

The gas exhaust pipe 510 is arranged at the bottom of the reactor 501, and it emits exhaust gas to an outside of the reactor 501.

When inside of the reactor 501 is heated with the heater 502 to a temperature between 800° C. and 1050° C., metal Ga in the Ga storage unit 505 melts because the melting point of Ga is about 29.8° C., so that the Ga melt 506 is generated. When HCl+H$_2$ introduced from the gas introduction pipe 503 is blown to the Ga melt 506, gallium chloride (GaCl) is generated.

Mixed gas containing GaCl and H$_2$ carrier gas is transported downwardly in a space of the reactor 501. The mixed gas containing GaCl and H$_2$ carrier gas is mixed with another mixed gas containing NH$_3$ and H$_2$ output from the gas introduction pipe 504 in a position below a bottom surface of the Ga storage unit 505, so that GaN is generated.

Because the GaN crystal 509 held on the susceptor 507 is heated to a temperature between 800° C. and 1050° C., GaN generated by chemical vapor reaction gets attached to the GaN crystal 509, so that a GaN crystal in the same quality as that of the GaN crystal 509 is grown.

The shaft 508 rotates and shifts downward during crystal growth, so that the GaN crystal 509 rotates and shifts downward accordingly. As a result, it is possible to maintain a constant distance between the gas introduction pipe 504 and the surface of the GaN crystal, even when thick GaN crystal is grown on the GaN crystal 509 by the HVPE method. Thus, it is possible to produce a bulked GaN crystal in constant quality.

FIG. 13 is a flowchart for explaining a method of producing a GaN crystal with the crystal producing apparatus 1000.

Figure 16A:
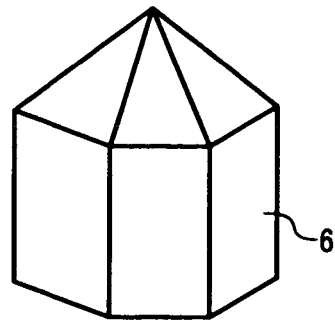
FIGS. 16A to 16C are schematic diagrams for explaining a method of producing a bulked GaN crystal according to the embodiments.

At step S1, the crystal forming unit 100 forms a first GaN crystal, i.e., the GaN crystal 6 (see FIG. 16A) by supplying nitride gas to mixed gas containing metal Na and metal Ga in a manner described above. At this point, a crystal in a columnar shape, i.e., longer in the c-axis direction than in the a-axis direction, is formed. The speed of growth of the GaN crystal 6 (a speed of crystal growth by the flux method) is, e.g., about 1 µm/h.

Figure 16B:
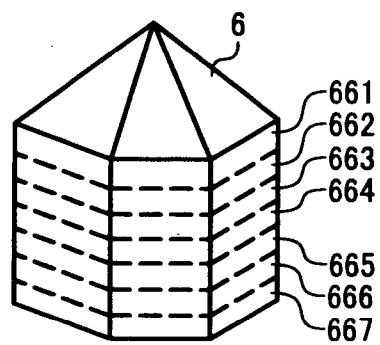

At step S2, the first GaN crystal is sliced (see FIG. 16B) and polished to obtain a plurality of GaN crystals 661 to 667.

Figure 16C:
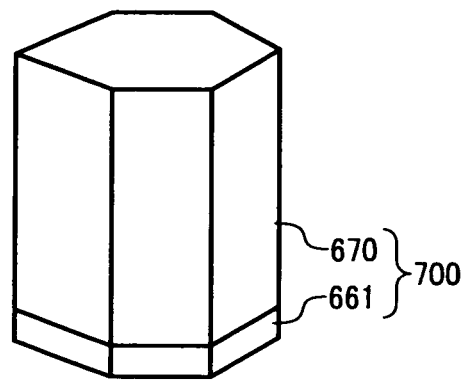

At step S3, the crystal growing unit 500 grows a second GaN crystal 670 by the HVPE method on a slice of the first GaN crystal 661 obtained at step S2, producing a bulked GaN crystal 700 (see FIG. 16C). The speed of growth of the second GaN crystal (a speed of crystal growth by the HVPE method) is, e.g., about 100 µm/h.

At step S4, the bulked GaN crystal is sliced into a plurality of GaN wafers, and the slices (wafers) of the GaN are polished. Each of the wafers serves as a GaN substrate.

As described above, according to the embodiment, the first GaN crystal is formed by the flux method, the first GaN is sliced and polished, and the second GaN crystal is grown on the sliced and polished first GaN crystal by the HVPE method to produce a bulked GaN crystal. Because the first GaN crystal has low dislocation density, which is equal to or smaller than $10^5$ cm$^{-2}$, in a desired quality, the second GaN crystal grown on the first GaN crystal by the HVPE method becomes such that has low dislocation density, which is equal to or smaller than $10^5$ cm$^{-2}$, in a desired quality.

FIG. 14 is a flowchart for explaining detailed procedures at step S1 shown in FIG. 13. The gas supply pipe 90 is separated into the gas supply pipes 91 and 92. The crucible 10, the reaction container 20, and the gas supply pipe 91 are introduced into a glove box (not shown), in which argon (Ar) gas is filled. Metal Na is input into the melt reservoir 23 of the reaction container 20 in Ar gas atmosphere (step S11). The Ar gas is such that amount of moisture is equal to or less than 1 part per million (ppm), and amount of oxygen is equal to or less than 1 ppm (same condition is applied in the following explanations).

Metal Na and metal Ga are put into the crucible 10 in Ar gas atmosphere (step S12). Mixture ratio between metal Na and metal Ga is set 5:5.

The floating cover 300 is put into the crucible 10 in Ar gas atmosphere (step S13), and the crucible 10 in which metal Na and metal Ga are present is placed inside the reaction container 20.

The crucible 10, the reaction container 20, and the gas supply pipe 91 are taken out of the glove box (not shown), and replaced at respective predetermined positions of the crystal forming unit 100 with Ar gas filled in each of the crucible 10, the reaction container 20, and the gas supply pipe 91.

The gas supply pipe 92 is connected to the valve 110. The valve 150 is then opened while the valve 110 is closed, so that Ar gas is output from each of the crucible 10, the reaction container 20, and the gas supply pipe 91 by the vacuum pump 160. Internal pressure of each of the crucible 10, the reaction container 20, and the gas supply pipe 91 is reduced to a predetermined pressure, which is equal to or less than 0.133 pascal (Pa), by using the vacuum pump 160. Subsequently, the valve 150 is closed, and the valve 110 is opened to fill nitride gas from the gas canister 130 into the crucible 10 and the reaction container 20 via the gas supply pipe 90. At this point, nitride gas is supplied to the crucible 10 and the reaction container 20 so that internal pressure of each of the crucible 10 and the reaction container 20 is regulated to around 0.1 mega pascal (MPa) by the pressure regulator 120.

When internal pressure of the reaction container 20 detected by the pressure sensor 170 reaches around 0.1 MPa, the valve 110 is closed and the valve 150 is opened, so that the nitride gas filled in each of the crucible 10, the reaction container 20, and the gas supply pipe 91 is emitted by using the vacuum pump 160. At this point, internal pressure of each of the crucible 10, the reaction container 20, and the gas supply pipe 91 is reduced to a predetermined pressure, which is equal to or less than 0.133 Pa, by using the vacuum pump 160.

A process of vacuuming of the crucible 10, the reaction container 20, and the gas supply pipe 91, and a process of filling nitride gas into the crucible 10, the reaction container 20, and the gas supply pipe 91 are repeated for a several times.

Subsequently, internal pressure of each of the crucible 10, the reaction container 20, and the gas supply pipe 91 is reduced to a predetermined pressure by using the vacuum pump 160. Then, the valve 150 is closed and the valve 110 is opened to fill nitride gas into the crucible 10, the reaction container 20, and the gas supply pipe 91 so that internal pressure of each of the crucible 10, the reaction container 20, and the gas supply pipe 91 reaches 1.01 MPa (step S14).

The heating units 50 and 60 heat the crucible 10 and the reaction. container 20 to 800° C. (a crystal growth temperature) (step S15), and the heater/cooler 70 controls a temperature of the alkali metal melt 280 at which vapor pressure $P_{Na}$ of metal Na evaporated from the alkali metal melt 280 substantially corresponds to vapor pressure $P_{Na-Ga}$ of metal Na evaporated from the melt mixture 270 (step S16).

The heater/cooler 80 controls a temperature of an area, i.e., the condensing area 90A, which is around the space 24 of the crucible 10 and the reaction container 20 in the gas supply pipe 90 that supplies nitride gas, to the condensation temperature Tcoh (step S17).

At this point, because a melting point of metal Na stored in the melt reservoir 23 is about 98° C., the metal Na melts during a process of heating the melt reservoir 23 to the evaporation suppression temperature Tevc, forming the alkali metal melt 280. As a result, a gas-liquid interface 1 (see FIG. 2) is generated. The gas-liquid interface 1 is positioned at an interface between the space 24 in the reaction container 20 and the alkali metal melt 280.

During a process of heating the crucible 10 and the reaction container 20 to 800° C., metal Na and metal Ga present in the crucible 10 is condensed to be liquid, generating the melt mixture 270 containing metal Na and metal Ga in the crucible 10. The floating cover 300 floats on the generated melt mixture 270, forming a clearance between the melt mixture 270 and the supporting unit 40.

When a temperature of the melt reservoir 23 is reaching the evaporation suppression temperature Tevc, and a temperature of the crucible 10 is reaching 800° C., the vapor pressure $P_{Na}$ of metal Na evaporated from the alkali metal melt 280 and the vapor pressure $P_{Na-Ga}$ of metal Na evaporated from the melt mixture 270 gradually increases, increasing metal Na vapor present in the space 24 of the reaction container 20. Portion of metal Na vapor present in the space 24 is diffused to the condensing area 90A of which temperature is lower than that of the crucible 10 and the reaction container 20, and condensed as the alkali metal melt 290 in the condensing area 90A. At this point, the vapor pressure $P_{Na}$ substantially corresponds to the vapor pressure $P_{Na-Ga}$.

The shifting mechanism 240 dips the seed crystal 5 into the melt mixture 270 in a manner described above (step S18). When the temperature of the crucible 10 and the reaction container 20 is about 800° C., which is a high-temperature state, nitride gas present in the space 24 is absorbed into the melt mixture 270 through medium of metal Na. Accordingly, crystal growth from the seed crystal 5 to the GaN crystal 6 is started. The temperature of the crucible 10 and the reaction container 20, and nitride gas pressure in the reaction container 20 are such that are present in the region REG3 described in connection with FIG. 11.

Subsequently, the temperature of the crucible 10 and the reaction container 20 is maintained at 800° C., a temperature of the alkali metal melt 280 in the melt reservoir 23 is maintained at the evaporation suppression temperature Tevc, and a temperature of the condensing area 90A is maintained at the condensation temperature Tcoh, for a predetermined time period, i.e., a few hours (step S19).

When crystal growth of the GaN crystal 6 is started, the temperature T5 of the GaN crystal 6 is. set to be the temperatures T1 or T2, which is lower than that of the melt mixture 270 (800° C.), in a manner described above (step S20).

When growth of the GaN crystal 6 proceeds, nitride gas in the space 24 is consumed, resulting in reducing amount of the nitride gas in the space 24. Accordingly, internal pressure P1 in the space 24 gets lower than internal pressure P2 in the gas supply pipe 90 (i.e., P1<P2), generating differential pressure between the space 24 and the gas supply pipe 90. Due to the differential pressure, nitride gas in the gas supply pipe 90 is supplied into the space 24 through medium of the alkali metal melt 290, i.e., metal Na melt. In other words, nitride gas is supplied into the space between the crucible 10 and the reaction container 20 (step S21). At this point, even when the alkali metal melt 290 is present in such a manner that the alkali metal melt 290 blocks entire cross sectional surface in a-axis direction of the gas supply pipe 90, it is possible to introduce nitride gas into the space 24 by sweeping aside the alkali metal melt 290 by using the differential pressure of the nitride gas because the alkali metal melt is liquid.

Subsequently, the GaN crystal 6 is shifted in a manner described above so that the GaN crystal 6 comes in contact with the melt mixture 270 (step S22). As a result, the GaN crystal 6 in a large size is formed.

After a predetermined time has elapsed, the temperature of the crucible 10 and the reaction container 20 is lowered (step S23), terminating formation of the first GaN crystal using flux method, and process control proceeds to step S2.

After step S23, a temperature of the melt reservoir 23 is maintained at the condensation temperature Tcoh, and a temperature of the condensing area 90A is maintained at the evaporation acceleration temperature Tev. As a result, the alkali metal melt 290 is transported from the condensing area 90A to the melt reservoir 23 by chemical vapor transport. Subsequently, a GaN crystal is formed by the flux method in accordance with a flowchart shown in FIG. 14.

As described above, a material for forming a GaN crystal by the flux method is supplied in such a state that the alkali metal melt 290 condensed in the condensing area 90A is transported to the melt reservoir 23.

Although it is explained that the first GaN crystal is formed at the temperature-pressure condition in the region REG3, it is possible to form the first GaN crystal at the temperature-pressure condition of the region REG2 or REG4. In this case, the seed crystal 5 is not fixed at one end of the supporting unit 40, and the one end is alternatively in contact with a surface of the melt mixture 270 or dipped into the melt mixture 270. Then, a plurality of crystal cores are formed on the one end of the supporting unit 40, the crystal cores are formed into one crystal by geometrical selection, resulting in growing the GaN crystal 6.

When using the temperature-pressure condition in the region REG2 or REG3, it is possible to grow the GaN crystal 6 on a bottom surface or a side surface of the crucible 10 that is in contact with the melt mixture 270 as well as on the one end of the supporting unit 40. Furthermore, when using the temperature-pressure condition in the region REG4, a crystal core is not attached to a bottom surface of the floating cover 300 and an internal surface of the crucible 10, so that it is possible to shift up and down the floating cover 300 in accordance with increase or decrease of amount of the melt mixture 270.

FIG. 15 is a flowchart for explaining detailed procedures at step S3 shown in FIG. 13. After step S2, the sliced and polished first GaN crystal is maintained on the susceptor 507 (step S31), and metal Ga is input into the Ga storage unit 505.

The heater 502 heats the reactor 501 to a temperature between 800° C. and 1050° C. (step S32), and material gas ($Nh_3+H_2$, $HCl+H_2$) is supplied into the reactor 501 (step S33)

The second GaN crystal is grown on the first GaN crystal (step S34), and a bulked GaN crystal is formed, terminating a process at step S3 and proceeding process control to step S4.

It is possible to produce a number of GaN substrates by forming a plurality of GaN wafers from the first GaN crystal, and by introducing the GaN wafers in a plurality of the crystal growing units 500, respectively, to form a bulked GaN crystal.

Furthermore, it is possible to repeatedly use the first GaN crystal by exclusively slicing a portion corresponding to the second GaN crystal when a bulked GaN crystal is sliced.

Moreover, it is possible to use a GaN wafer sliced and polished from the second GaN crystal that has grown by the HVPE method as an HVPE substrate. In other words, when a GaN crystal having low dislocation density and less tilt grain boundary is used as a substrate, a GaN crystal grown on the substrate also has low dislocation density and less tilt grain boundary, so that it is possible to repeatedly use the second GaN crystal as a substrate.

Furthermore, it is possible to produce a bulked GaN crystal by growing the second GaN crystal on the first GaN crystal without slicing the first GaN crystal.

In this case, a process performed at step S2 is omitted, and the first GaN crystal formed by the flux method is maintained on the susceptor 507 until process control proceeds to step S31.

A process of forming the first GaN crystal at the temperature-pressure condition in the region REG3, and producing a GaN substrate having an m-plane as a principal surface after slicing the first GaN crystal is explained with reference to FIGS. 17A to 17E.

Figure 17A:
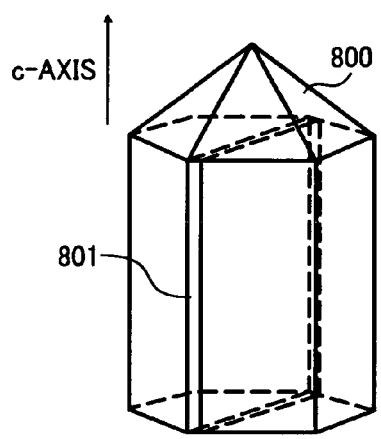
FIGS. 17A to 17E are schematic diagrams for explaining a first example of producing a GaN substrate according to the embodiment.

A hexagonal columnar GaN crystal 800 (first GaN crystal) elongated in a c-axis direction is formed from a seed crystal at the temperature-pressure condition in the region REG3 by the flux method (FIG. 17A).

Figure 17B:
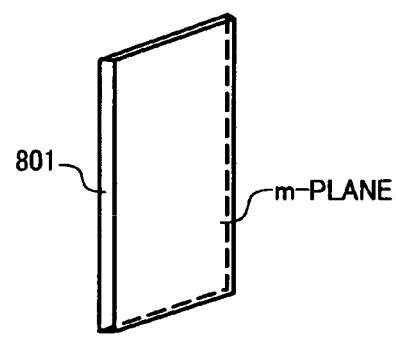

The GaN crystal 800 is sliced along the m-plane, and polished to form a GaN wafer 801 having the m-plane as a principal surface (FIG. 17B).

Figure 17C:
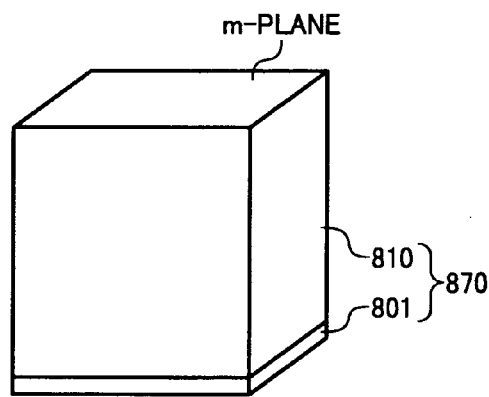
Figure 17D:
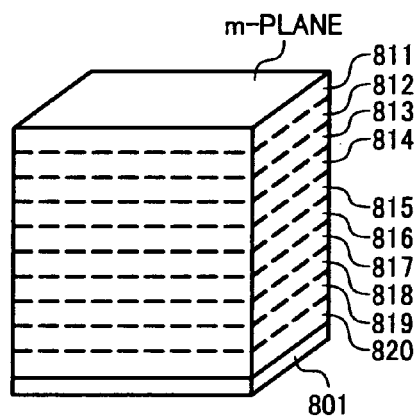

A bulked GaN crystal 870 is produced by growing a GaN crystal 810 (second GaN crystal) on the m-plane of the GaN wafer 801 by the HVPE method (FIG. 17C).

Figure 17E:
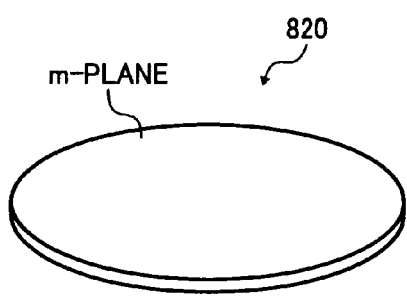

The bulked GaN crystal 870 is sliced along the m-plane (FIG. 17D), and polished to produce GaN substrates 811 to 820, each having the m-plane as a principal surface (FIG. 17E).

A process of forming the first GaN crystal at the temperature-pressure condition in the region REG3, and producing a GaN substrate having an a-plane as a principal surface after slicing the first GaN crystal is explained with reference to FIGS. 18A to 18E.

Figure 18A:
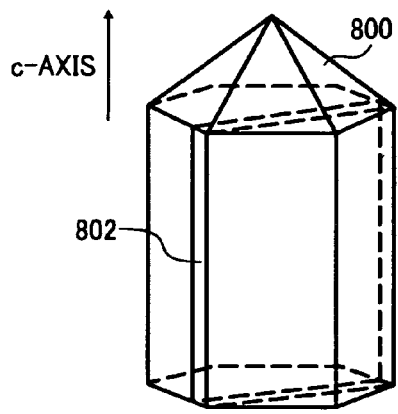
FIGS. 18A to 18E are schematic diagrams for explaining a second example of producing a GaN substrate according to the embodiment.

A hexagonal columnar GaN crystal 800 (first GaN crystal) elongated in a c-axis direction is formed from a seed crystal at the temperature-pressure condition in the region REG3 by the flux method (FIG. 18A).

Figure 18B:
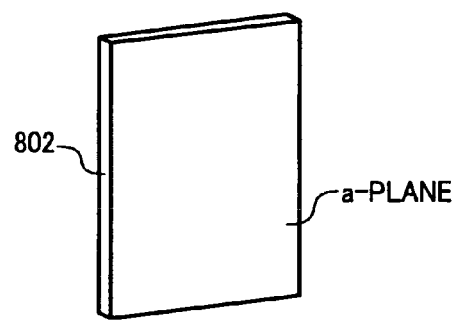

The GaN crystal 800 is sliced along the a-plane, and polished to form a GaN wafer 802 having the a-plane as a principal surface (FIG. 18B).

Figure 18C:
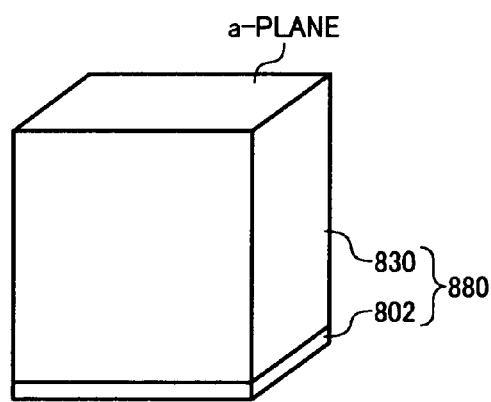
Figure 18D:
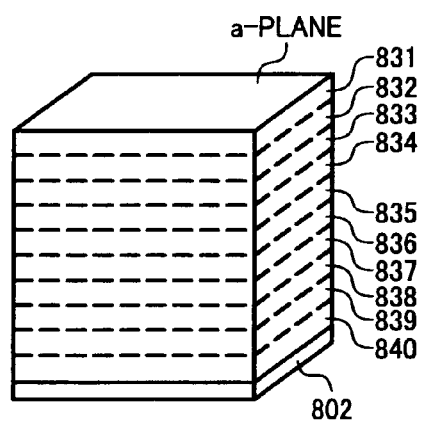

A bulked GaN crystal 880 is produced by growing a GaN crystal 830 (second GaN crystal) on the a-plane of the GaN wafer 801 by the HVPE method (FIG. 18C).

Figure 18E:
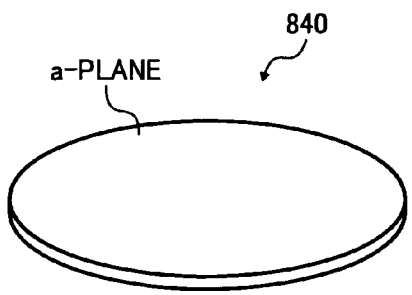

The bulked GaN crystal 880 is sliced along the a-plane (FIG. 18D), and polished to produce GaN substrates 831 to 840, each having the a-plane as a principal surface (FIG. 18E).

A process of forming the first GaN crystal at the temperature-pressure condition in the region REG3, and producing a GaN substrate having a c-plane as a principal surface after slicing the first GaN crystal is explained with reference to FIGS. 19A to 19E.

Figure 19A:
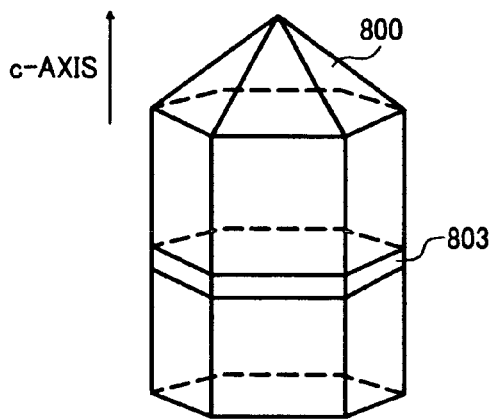
FIGS. 19A to 19E are schematic diagrams for explaining a third example of producing a GaN substrate according to the embodiment.

A hexagonal columnar GaN crystal 800 (first GaN crystal) elongated in a c-axis direction is formed from a seed crystal at the temperature-pressure condition in the region REG3 by the flux method (FIG. 19A).

Figure 19B:
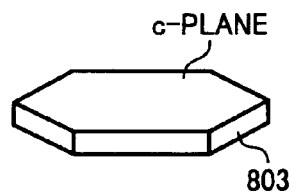

The GaN crystal 800 is sliced along the c-plane, and polished to form a GaN wafer 803 having the a-plane as a principal surface (FIG. 19B).

Figure 19C:
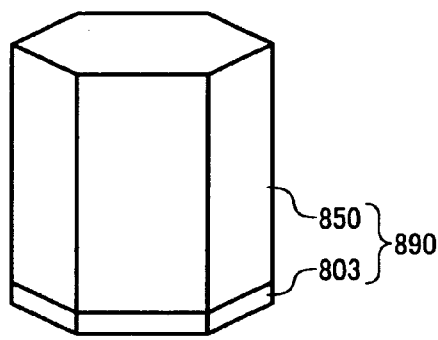
Figure 19D:
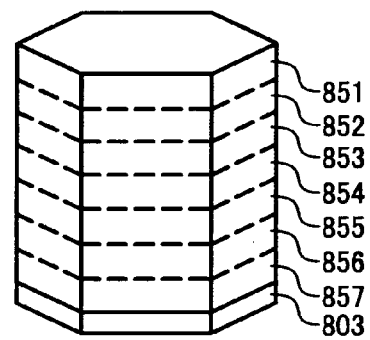

A bulked GaN crystal 890 is produced by growing a GaN crystal 850 (second GaN crystal) on the c-plane of the GaN wafer 801 by the HVPE method (FIG. 19C).

Figure 19E:
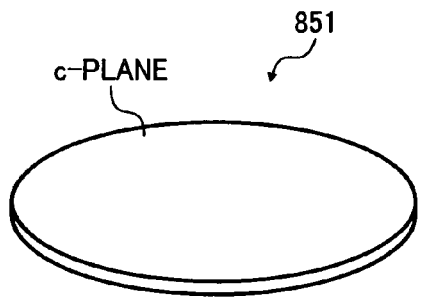

The bulked GaN crystal 890 is sliced along the c-plane (FIG. 19D), and polished to produce GaN substrates 851 to 857, each having the c-plane as a principal surface (FIG. 19E).

A process of forming the first GaN crystal at the temperature-pressure condition in the region REG4, and producing a GaN substrate having a c-plane as a principal surface without slicing the first GaN crystal is explained with reference to FIGS. 20A to 20D.

Figure 20A:
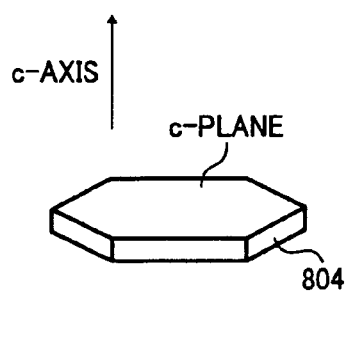
FIGS. 20A to 20D are schematic diagrams for explaining a fourth example of producing a GaN substrate according to the embodiment.

A large plate-shaped GaN. crystal 804 (first GaN crystal) is formed by floating a crystal on a surface of the melt mixture 270 at the temperature-pressure condition in the region REG4 by the flux method (FIG. 20A).

The c-plane of the GaN crystal 804 is polished.

Figure 20B:
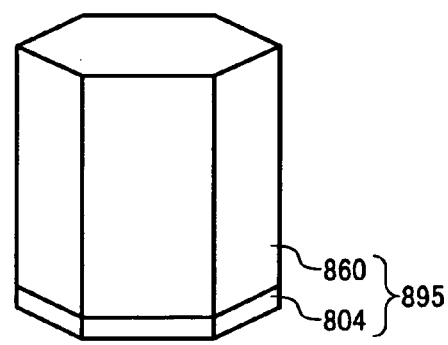
Figure 20C:
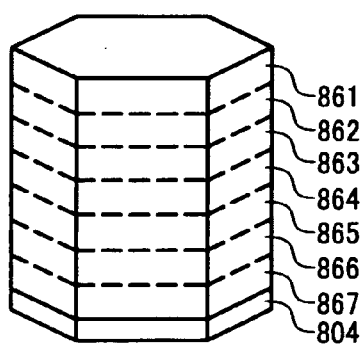

A bulked GaN crystal 895 is produced by growing a GaN crystal 860 (second GaN crystal) on the c-plane of the GaN crystal 804 by the HVPE method (FIG. 20B).

Figure 20D:
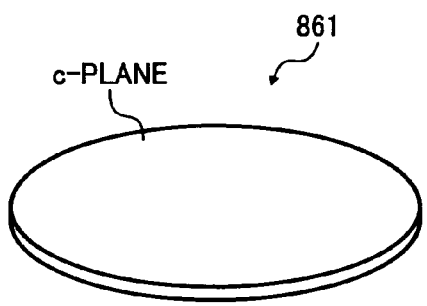

The bulked GaN crystal 895 is sliced along the c-plane (FIG. 20C), and polished to produce GaN substrates 861 to 867, each having the c-plane as a principal surface (FIG. 20D).

A process of forming the first GaN crystal at the temperature-pressure condition in the region REG3, and producing a GaN substrate having a c-plane as a principal surface without slicing the first GaN crystal is explained with reference to FIGS. 21A to 21D.

Figure 21A:
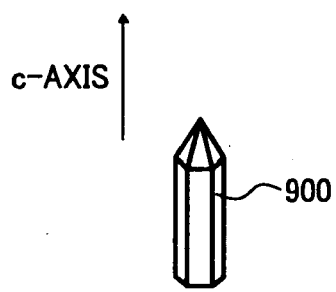
FIGS. 21A to 21D are schematic diagrams for explaining a fifth example of producing a GaN substrate according to the embodiment.

A hexagonal columnar GaN crystal 900 (first GaN crystal) elongated in a c-axis direction is formed from a seed crystal at the temperature-pressure condition in the region REG3 by the flux method (FIG. 21A).

Figure 21B:
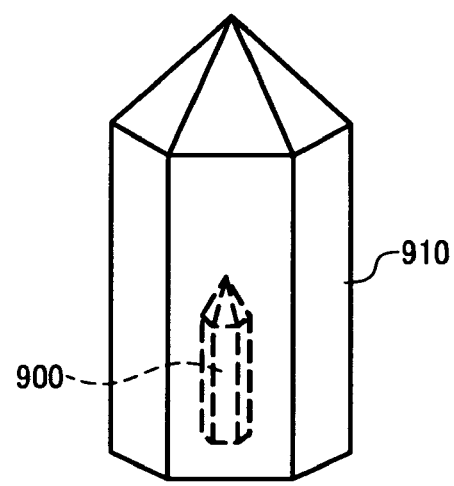
Figure 21C:
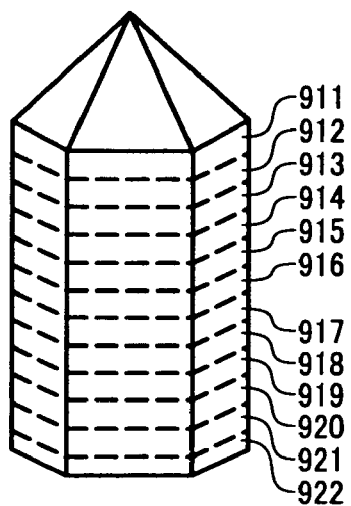

A bulked GaN crystal 910 containing the GaN crystal is produced by growing a GaN crystal (second GaN crystal) on the GaN crystal 900 by the HVPE method (FIG. 21B).

Figure 21D:
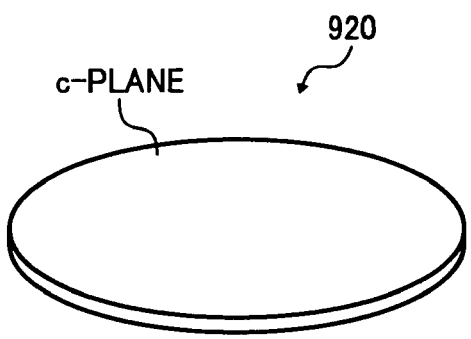

The bulked GaN crystal 910 is sliced along the c-plane (FIG. 21C), and polished to produce GaN substrates 911 to 922, each having the c-plane as a principal surface (FIG. 21D).

A process of forming the first GaN crystal at the temperature-pressure condition in the region REG3, and producing a GaN substrate having an m-plane as a principal surface without slicing the first GaN crystal is explained with reference to FIGS. 22A to 22D.

Figure 22A:
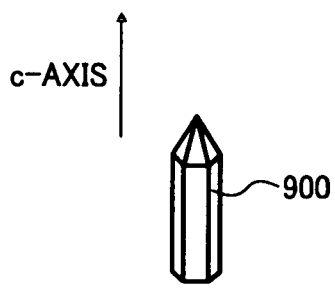
FIGS. 22A to 22D are schematic diagrams for explaining a sixth example of producing a GaN substrate according to the embodiment.

The hexagonal columnar GaN crystal 900 (first GaN crystal) elongated in a c-axis direction is formed from a seed crystal at the temperature-pressure condition in the region REG3 by the flux method (FIG. 22A).

Figure 22B:
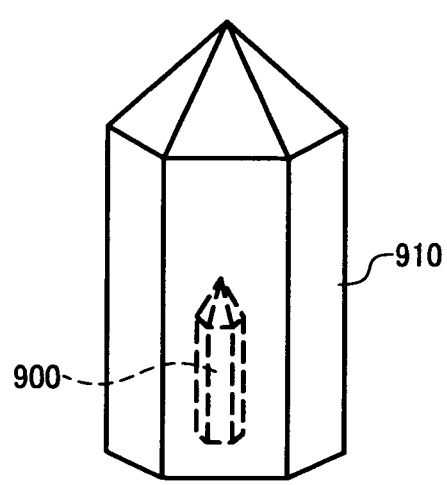
Figure 22C:
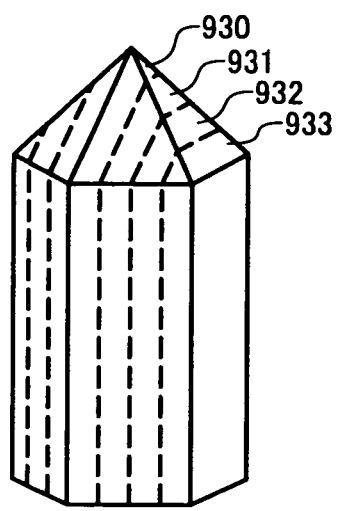

The bulked GaN crystal 910 containing the GaN crystal 900 is produced by growing a GaN crystal (second GaN crystal) on the GaN crystal 900 by the HVPE method (FIG. 22B).

Figure 22D:
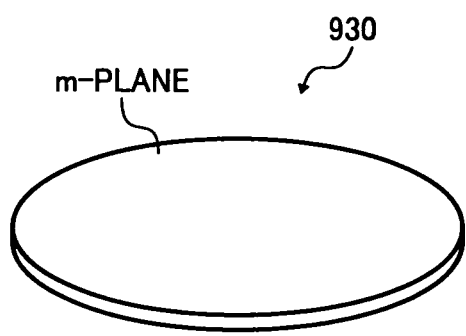

The bulked GaN crystal 910 is sliced along the m-plane (FIG. 22C), and polished to produce GaN substrates 930 to 933, each having the m-plane as a principal surface (FIG. 22D).

A process of forming the first GaN crystal at the temperature-pressure condition in the region REG3, and producing a GaN substrate having an a-plane as a principal surface without slicing the first GaN crystal is explained with reference to FIGS. 23A to 23D.

Figure 23A:
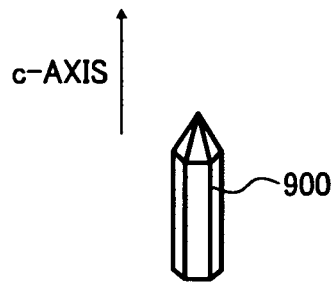
FIGS. 23A to 23D are schematic diagrams for explaining a seventh example of producing a GaN substrate according to the embodiment.

The hexagonal columnar GaN crystal 900 (first GaN crystal) elongated in a c-axis direction is formed from a seed crystal at the temperature-pressure condition in the region REG3 by the flux method (FIG. 23A).

Figure 23B:
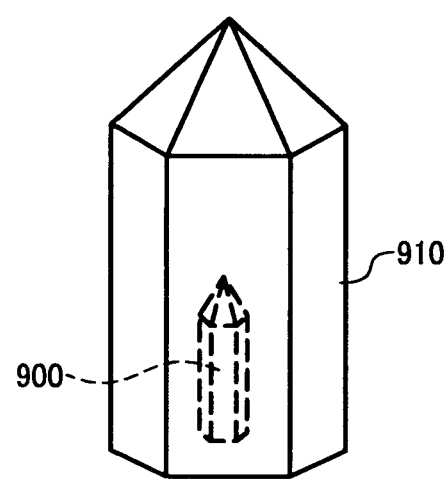
Figure 23C:
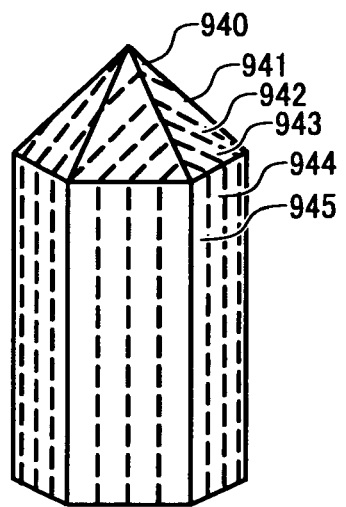

The bulked GaN crystal 910 containing the GaN crystal 900 is produced by growing a GaN crystal (second GaN crystal) on the GaN crystal 900 by the HVPE method (FIG. 23B).

Figure 23D:
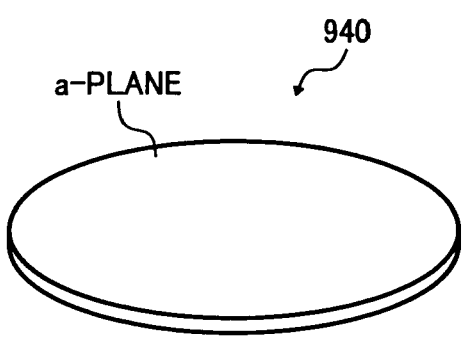

The bulked GaN crystal 910 is sliced along the a-plane (FIG. 23C), and polished to produce GaN substrates 930 to 933, each having the a-plane as a principal surface (FIG. 23D).

A process of forming the first GaN crystal at the temperature-pressure condition in the region REG4, and producing a GaN substrate having a c-plane as a principal surface without slicing the first GaN crystal is explained with reference to FIGS. 24A to 24D.

Figure 24A:
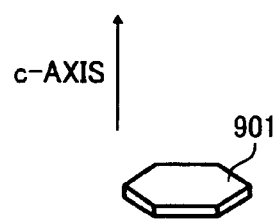
FIGS. 24A to 24D are schematic diagrams for explaining an eighth example of producing a GaN substrate according to the embodiment.

A platelet GaN crystal 901 (first GaN crystal) is formed by floating a crystal on a surface of the melt mixture 270 at the temperature-pressure condition in the region REG4 by the flux method (FIG. 24A).

Figure 24B:
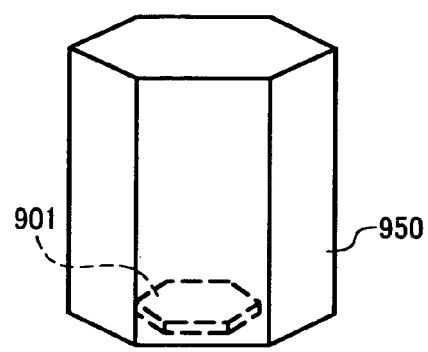
Figure 24C:
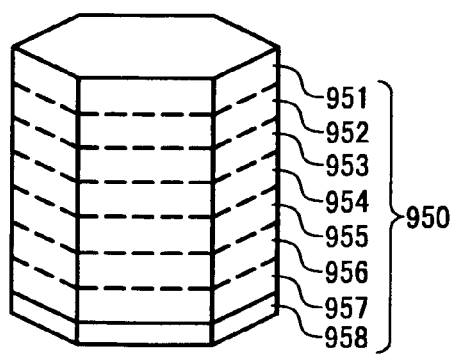

A bulked GaN crystal 950 containing the GaN crystal 901 is produced by growing a GaN crystal (second GaN crystal) on the GaN crystal 901 by the HVPE method (FIG. 24B).

Figure 24D:
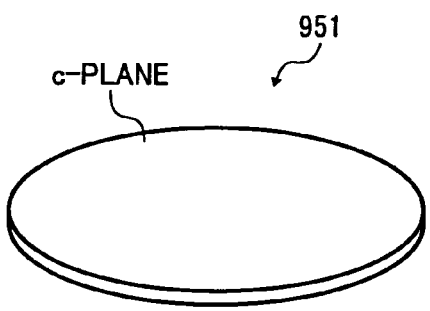

The bulked GaN crystal 950 is sliced along the c-plane (FIG. 24C), and polished to produce GaN substrates 951 to 958, each having the c-plane as a principal surface (FIG. 24D).

In such a condition that the first GaN crystal is in plate shape, it is possible that a principal crystal surface of the first GaN crystal, and a principal crystal surface of a GaN substrate sliced from a bulked GaN crystal can be different from each other. In other words, it is possible to produce a GaN substrate with a desired principal crystal surface.

As described above, according to the crystal producing apparatus 1000, a crystal producing method of the present invention is realized in above explained processes of producing a bulked GaN crystal. Furthermore, a substrate producing method of the present invention is realized in above explained processes of producing a GaN substrate.

The crystal producing apparatus 1000 includes the crystal forming unit 100 that forms the first GaN crystal by supplying nitride gas into melt mixture containing alkali metal Na and group-III metal Ga, and the crystal growing unit 500 that grows the second GaN crystal on the first GaN crystal by the HVPE method. Because the first GaN crystal is homogeneous and has low dislocation density, which is equal to or smaller than $10^5$ cm$^{-2}$, in a preferable quality, and the second GaN crystal is grown on such first GaN crystal, the second GaN crystal that is homogeneous and has low dislocation density can be grown. Therefore, it is possible to produce a bulked GaN crystal that is homogeneous and has low dislocation density with less cost.

A speed of crystal growth of the second GaN crystal can be set faster than that of the first GaN crystal. As a result, it is possible to produce a bulked GaN crystal that is homogeneous and has low dislocation density with a short manufacturing time.

The GaN substrate is formed by slicing a bulked GaN crystal that is homogeneous and has low dislocation density. Therefore, it is possible to produce a GaN substrate in preferable quality and having a large area with a desired crystal principal surface, such as c-plane. (polar face), m-plane (non-polar face), a-plane (non-polar face), or other non-polar faces. Thus, it is possible to realize a nitride gallium substrate having a desired principal surface in preferable quality with less manufacturing costs.

Although it is explained that the crystal growth temperature in the flux method is 800° C. in the above embodiment, the crystal growth temperature in the flux method can be such that is within the regions REG2 and REG3. Furthermore, nitride gas pressure can be such that is within the regions REG2 and REG3.

The crystal forming unit 100 can be such that does not include the vibration applying unit 230, the shifting mechanism 240, and the vibration detecting unit 250. In such situation, the GaN crystal 6 is not shifted upward or downward, and alternatively, the supporting unit 40 is set in such a manner that the bottom surface 41B of the supporting unit 40 comes in contact with the melt mixture 270 containing melted metal Na and melted metal Ga in the crucible 10. Therefore, the GaN crystal 6 is grown from the seed crystal 5. As a result, it is possible to form the GaN crystal 6 in a large size.

Furthermore, the crystal forming unit 100 can be such that does not include the pipe 180, the thermocouple 190, the gas supply pipe 200, the flowmeter 210, and the gas canister 220. In such situation, the temperature T5 of the GaN crystal 6 is not controlled to be lower than that of the melt mixture 270. However, the GaN crystal 6 is in contact with the melt mixture 270 by the supporting unit 40, so that the GaN crystal 6 is grown from the seed crystal 5 in such a state that variation in mixture ratio between metal Na and metal Ga is controlled. As a result, it is possible to form the GaN crystal 6 in a large size.

The crystal forming unit can be such that does not include the pipe 180, the thermocouple 190, the gas supply pipe 200, the flowmeter 210, the gas canister 220, the vibration applying unit 230, the shifting mechanism 240, and the vibration detecting unit 250. In such situation, the GaN crystal 6 is not shifted upward or downward, and the temperature T5 of the GaN crystal 6 is not controlled to be lower than that of the melt mixture 270. However, the GaN crystal 6 is supported by the supporting unit 40 in such a manner that the GaN crystal 6 comes in contact with the melt mixture 270 containing melted metal Na and melted metal Ga in the crucible 10. Therefore, the GaN crystal 6 is grown from the seed crystal 5 in such a state that variation in mixture ratio between metal Na and metal Ga is controlled. As a result, it is possible to form larger GaN crystal.

According to the embodiment, it is explained that metal Na and metal Ga are input in the crucible 10 in Ar gas atmosphere, and metal Na is input into the melt reservoir 23 and the condensing area 90A in Ar gas atmosphere. However, it is possible to input metal Na and metal Ga into the crucible, and input metal Na into the melt reservoir 23 and the condensing area 90A in other gas atmosphere, such as helium (He), neon (Ne), or krypton (Kr), instead of Ar atmosphere. It is normally preferable to input metal Na and metal Ga into the crucible 10, and input metal Na into the melt reservoir 23 and the condensing area 90A, in inactive gas atmosphere or in nitride gas atmosphere. In such situation, inactive gas atmosphere or nitride gas atmosphere is such that amount of moisture is equal to or less than 1 ppm, and amount of oxygen is equal to or less than 1 ppm.

Furthermore, although it is explained that metal Ga and metal Na are mixed with each other, it is possible to mix metal Ga with other alkali metal, such as lithium (Li) or potassium (K), or alkaline earth metal, such as magnesium (Mg), calcium (Ca), or strontium (Sr).

Moreover, it is possible to use other compounds containing nitride, such as sodium azide or ammonia, instead of nitride gas.

Furthermore, although Ga is explained as group-III metal, it is possible to use boron (B), aluminum (Al), or indium (In) as group-III metal.

In other words, the crystal forming unit works sufficient1y as long as the crystal forming unit forms group-III nitride crystal using melt mixture in which alkali metal or alkaline earth metal is mixed with group-III metal (including boron).

It is possible to use nitride gas or other mixed gas instead of $H_2$ as carrier gas in the HVPE method. The crystal growth temperature can be others as long as a GaN crystal can be grown.

Furthermore, although it is explained that the HVPE method is employed as a chemical vapor method, other chemical vapor methods are applicable. For example, it is possible to apply other chemical vapor methods, such as gallium hydride vapor phase epitaxy (GaH-VPE) in which gallium hydride (GaH) and ammonia are used as material, a method of growing GaN by carbothermal reduction and nitridation of gallium oxide ($Ga_2O_3$) and causing $Ga_2O_3$ to react with ammonia, or sublimation method.

A GaN substrate produced by the crystal producing apparatus 1000 is used for forming semiconductor devices such as light emitted diodes, semiconductor lasers, photodiodes, or transistors.

According to an aspect of the present invention, in a crystal producing apparatus and a crystal producing method, a first group-III nitride crystal is formed by the flux method, and a second group-III nitride crystal is grown on the first group-III nitride crystal by chemical vapor method. Because the first group-III nitride crystal is homogeneous and in preferable quality, and the second group-III nitride crystal is grown on such first group-III nitride crystal, it is possible to grow a homogeneous second group-III nitride crystal in desired quality. Therefore, it is possible to produce a homogeneous bulked group-III nitride crystal in desired quality with less cost.

According to another aspect of the present invention, a bulked group-III nitride crystal produced in the crystal producing method is sliced. As a result, it is possible to produce a group-III nitride substrate having a desired principal surface with less cost.

According to still another aspect of the present invention, a second nitride gallium crystal is grown on a homogeneous first nitride gallium crystal in desired quality, and is formed by the flux method. Therefore, it is possible to produce a homogeneous bulked nitride gallium crystal in desired quality with less manufacturing costs.

According to still another aspect of the present invention, a bulked nitride gallium crystal is sliced to form a nitride gallium substrate. As a result, it is possible to produce a nitride gallium substrate having a desired principal surface in desired quality with less cost.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method for producing a group-III nitride crystal, the method comprising:
   (a) obtaining a first group-III nitride crystal, grown by a flux method utilizing a seed crystal at a first crystal-growth speed, and having a dislocation density equal to or less than $10^5$ $cm^{-2}$;
   (b) growing a second group-III nitride crystal in bulk at a second crystal-growth speed, by vapor phase epitaxy method on a principal surface of the first group-III nitride crystal having the dislocation density equal to or less than $10^5$ $cm^{-2}$,
   wherein the second crystal-growth speed is faster than the first crystal-growth speed,
   wherein the first group-III nitride crystal is in a columnar shape, in which a length in a c-axis direction is longer than a length in an a-axis direction, and
   wherein the principal surface of the first group-III nitride crystal on which the second group-III nitride crystal is grown is an a-plane.

2. The method according to claim 1, further comprising slicing the first group-III nitride crystal before performing the growing.

3. The method according to claim 2, wherein the first group-III nitride crystal is capable of being reused.

4. The method according to claim 1, wherein the first group-III nitride crystal and the second group-III nitride crystal are gallium nitride crystals.

5. A method of producing a substrate, the method comprising:
   manufacturing a bulk group-III nitride crystal by using the method according to claim 1; and
   manufacturing a group-III nitride substrate by slicing the bulk group-III nitride crystal.

6. The method according to claim 5, wherein the bulk group-III nitride crystal is sliced in such a manner that a principal surface of the group-III nitride substrate that is made by slicing bulk the group-III nitride crystal is an a-plane.

7. The method according to claim 5, wherein the bulk group-III nitride crystal is a gallium nitride crystal.

8. The method according to claim 1, wherein the flux method includes:
   detecting a temperature of the seed crystal and first group-III nitride crystal and a temperature of a melt mixture; and
   controlling a flow rate of the nitrogen source gas supplied into the melt mixture, to change the temperature of the seed crystal and first group-III nitride crystal being formed to be lower than the temperature of the melt mixture.

9. The method according to claim 1, wherein a speed of crystal growth of the first group-III nitride crystal in the c-axis direction is faster than a speed of crystal growth in a direction perpendicular to the c-axis direction.

10. The method according to claim 1, wherein a length of the first group-III nitride crystal is longer in the c-axis direction than a length of the first group-III nitride crystal in a direction perpendicular to the c-axis direction.

11. The method according to claim 1, wherein the first group-III nitride crystal is in a hexagonal columnar shape and is elongated in the c-axis direction.

12. The method according to claim 1, wherein the flux method includes:
   detecting a temperature of the seed crystal and first group-III nitride crystal and a temperature of a melt mixture; and
   controlling a flow rate of nitrogen source gas supplied into the melt mixture, to change the temperature of the seed crystal and first group-III nitride crystal to gradually decrease while the temperature of the melt mixture is constant.

13. A gallium nitride crystal in bulks comprising:
   a first gallium nitride crystal formed by a flux method utilizing a seed crystal, the first gallium nitride crystal having a dislocation density equal to or less than $10^5$ $cm^{-2}$; and
   a second gallium nitride crystal grown by vapor phase epitaxy, on an a-plane of the first gallium nitride crystal having the dislocation density equal to or less than $10^5$ $cm^{-2}$,
   wherein the first gallium nitride crystal is in a columnar shape, in which a length in a c-axis direction is longer than a length in an a-axis direction.

14. The gallium nitride crystal according to claim 13, wherein the first gallium nitride crystal is enclosed by the second gallium nitride crystal.

15. The gallium nitride crystal in bulks according to claim 13, wherein a dislocation density of the second gallium nitride crystal is not larger than $10^5$ $cm^{-2}$.

16. A group-III nitride substrate formed by a process comprising:
- (a) obtaining, as a first group-III nitride wafer, a slice of a first group-III nitride crystal, grown by a flux method utilizing a seed crystal at a first crystal-growth speed, and having a dislocation density equal to or less than $10^5$ cm$^{-2}$;
- (b) growing a second group-III nitride crystal in bulk at a second crystal-growth speed, by vapor phase epitaxy method on a first principal surface of the first group-III nitride wafer obtained in (a) and having the dislocation density equal to or less than $10^5$ cm$^{-2}$;
- (c) slicing the second group-III nitride crystal formed in (b) to form a substrate having a second principal surface,
- wherein the second principal surface of the substrate formed in (c) is parallel to the first principal surface of the first group-III nitride wafer on which the second group-III nitride crystal is grown in (b), and
- wherein the first group-III nitride crystal is in a columnar shape, in which a length in a c-axis direction is longer than a length in an a-axis direction.

17. The group-III nitride substrate of claim 16, wherein each of the first and second principal surfaces is formed in an a-plane.

18. The group-III nitride substrate of claim 16, wherein each of the first and second principal surfaces is formed in an m-plane.

19. The group-III nitride substrate of claim 16, wherein each of the first and second principal surfaces is formed in a c-plane.

* * * * *